United States Patent [19]
Ostolski

[11] Patent Number: 5,476,688
[45] Date of Patent: Dec. 19, 1995

[54] PROCESS FOR THE PREPARATION OF NOBLE METAL COATED NON-NOBLE METAL SUBSTRATES, COATED MATERIALS PRODUCED IN ACCORDANCE THEREWITH AND COMPOSITIONS UTILIZING THE COATED MATERIALS

[76] Inventor: Marian J. Ostolski, 165 Long Clove Rd., New City, N.Y. 10956

[21] Appl. No.: 85,457

[22] Filed: Jun. 30, 1993

Related U.S. Application Data

[63] Continuation of Ser. No. 480,224, Feb. 15, 1990, abandoned, which is a continuation-in-part of Ser. No. 237,898, Aug. 29, 1988, abandoned.

[30] Foreign Application Priority Data

Aug. 28, 1989 [CA] Canada ......................... 609531

[51] Int. Cl.⁶ ......................................... B05D 1/18
[52] U.S. Cl. ..................... 427/437; 427/443.1; 106/1.18; 106/1.19; 106/1.21
[58] Field of Search .................... 427/304, 305, 427/306, 437, 438, 443.1; 106/1.18, 1.19, 1.20, 1.21, 1.24; 252/500, 518

[56] References Cited

U.S. PATENT DOCUMENTS

| | | | |
|---|---|---|---|
| 3,202,488 | 8/1965 | Ehrreich et al. | 29/192 |
| 3,212,917 | 10/1965 | Tsu et al. | 427/305 |
| 3,589,916 | 6/1971 | McCormack | 427/437 |
| 3,725,308 | 4/1973 | Ostolski | 252/513 |
| 3,993,808 | 11/1976 | Inaba et al. | 427/437 |
| 4,567,066 | 1/1986 | Schultz et al. | 427/305 |
| 4,643,918 | 2/1987 | Orban | 427/304 |

FOREIGN PATENT DOCUMENTS

| | | | |
|---|---|---|---|
| 0731507 | 4/1966 | Canada | 427/437 |
| 8501070 | 3/1985 | WIPO | 427/437 |

OTHER PUBLICATIONS

*IBM Technical Disclosure Bulletin* vol. 31 No. 6 Nov. 1988 "Copper Surface Preparation Process for Electronless Plating" pp. 339–340.

Metal Finishing Guidebook Directory For 1967, Metals and Plastics Publications, Inc., Westwood, New Jersey (1967), p. 485 no month.

*Primary Examiner*—Mark L. Bell
*Assistant Examiner*—Paul Marcantoni
*Attorney, Agent, or Firm*—Howard R. Jaeger

[57] ABSTRACT

A multi-coating step immersion coating process for producing a coating of a noble metal on a non-noble metal substrate, wherein the noble metal is of a predetermined amount expressed as a percent of the total weight of coated product, and wherein the non-noble metal substrate is in the form of fine particles or a powder is disclosed. The process also utilizes inter-plating step and post-plating step rinsing step sequences which together with the use of the plurality of coating steps consistently results in high quality product having a uniform coating, excellent corrosion resistance and excellent electrical conductivity. Use of the coated products produced according to the process in a variety of electrically conductive compositions, including plastics, adhesives and inks, and in plastic and resin based electromagnetic shielding materials is also disclosed.

67 Claims, 3 Drawing Sheets

PROCESS FOR THE PREPARATION OF NOBLE METAL COATED NON-NOBLE METAL SUBSTRATES, COATED MATERIALS PRODUCED IN ACCORDANCE THEREWITH AND COMPOSITIONS UTILIZING THE COATED MATERIALS

This is a continuation of application Ser. No. 07/480,224, filed on Feb. 15, 1990, now abandoned; which was a continuation-in-part of application Ser. No. 07/237,898, filed on Aug. 29, 1988, now abandoned.

FIELD OF THE INVENTION

This invention relates to a process for producing a coating of a noble metal onto a non-noble metal substrate. More particularly, the invention relates to a process for preparing electrically conductive non-noble metallic particles with a noble metal coating. Still more particularly, the invention relates to a process for preparing an electrically conductive powder in the form of a non-noble metal such as copper, nickel, aluminum and the like, coated with a noble metal such as silver, gold, platinum and the like. The invention especially relates to the preparation of an electrically conductive silver-coated copper powder, an electrically conductive silver-coated nickel powder, an electrically conductive silver-coated aluminum powder, and an electrically conductive gold-coated nickel powder. The invention also relates to the preparation of useful products incorporating the above coated materials, including electromagnetic interference shielding materials in which the coated materials are incorporated in a rubber matrix, electrically conductive adhesives, and electrically conductive inks.

BACKGROUND OF THE INVENTION

Electrically conductive noble metal-coated metallic particles, especially powders, are an important additive in the preparation of electrically conductive plastics, adhesives and inks, and in resin matrix based electromagnetic interference shielding materials.

The most commercially useful of such coated particles and powders are those wherein copper, nickel or aluminum substrates are coated with silver or gold. A number of processes have been developed over the years for the preparation of such noble metal-coated metallic materials.

For example, U.S. Pat. No. 3,202,488 to Ehrreich et al for "Silver-Plated Copper Powder" discloses a process for preparing silver-plated copper powder by replacement plating silver from silver cyanide solution whereby copper ions on the surface of the copper powder are replaced with silver ions from the solution.

U.S. Pat. No. 2,771,380 to Coleman et al for "Method of Plating Copper Particles With Silver" discloses a process for silver-plating copper particles requiring that the copper particles first be dry-mixed with an agent which maintains the copper particles in a separated or dispersed condition, prior to immersion in an aqueous silver plating bath.

U.S. Pat. No. 4,450,188 to Kawasumi for "Process for the Preparation of Precious Metal Coated Particles" discloses processes for coating a metal core material with a precious metal wherein a suspension of precious metal salt particles and dissolved precious metal salt ions; or a solution of dissolved precious metal salt ions; or a mixture of precious metal ions and a chelate of a precious metal compound in a suspended phase, are alternatively mixed with an aqueous suspension of core material particles, to carry out the coating of the core with the precious metal in a gelling suspension.

U.S. Pat. No. 4,652,465 to Koto et al. for "Process for the Production of a Silver Coated Copper Powder and Conductive Coating Composition" discloses a process wherein silver is precipitated on the surface of a copper powder by means of a silver complex solution containing a silver salt, an ammonium carbonate compound and ammonia water, which is added dropwise to a suspension of copper powder, alternatively, in water, in ammonia water, and in an aqueous solution of an ammonium carbonate compound.

U.S. Pat. No. 4,716,081 to Ehrreich for "Conductive Compositions and Conductive Powders for Use Therein" discloses a process for producing silver-coated non-noble metal powders, principally copper, by replacement plating from a solution containing ions of the noble metal, essentially as disclosed in U.S. Pat. No. 3,202,488, but further requiring high temperature heat treatment of the coated material at a temperature of 200° C. for from 24 to several hundred hours or 150° C. from 70 to 1500 hours.

U.S. Pat. No. 4,434,541 to Powers, Jr. for "Electromagnetic Shielding" discloses a process for preparing electromagnetic interference shielding materials utilizing electrically conductive solid metal particles consisting of an aluminum core on which it is first required to coat a layer of tin, zinc or nickel prior to plating with an outer coating of silver.

U.S. Pat. No. 3,989,606 to Kampert for "Metal Plating On Aluminum" discloses a process in which an aluminum substrate is first immersion coated with zinc prior to being electroplated with nickel.

All of the above processes, however, have certain disadvantages, which may result in the coated products produced not being of uniformly and consistently high quality, or the processes require some step, such as a long duration high temperature heat treatment in order to produce acceptable product, but which renders the process impractical and uneconomical for large scale commercial use. Some of the above processes have the disadvantage of requiring that the substrate material first be plated with an intermediate metal prior to coating with the precious metal. One utilizes a combination of immersion coating to produce the intermediate layer, followed by electro-plating to remove the intermediate layer and replace it with the outer coating of precious metal. Such a dual process has the disadvantage of also requiring a source of electricity, and depending on the costs of electricity, can be prohibitively costly in terms of both capital equipment costs and operating costs. Regardless of whether the precious metal coating is deposited by an immersion coating or an electro-plating process, in either case, the outer coating of precious metal may not completely coat or replace the intermediate layer, particularly because the coating with precious metal is performed in a single step, and may not be of uniform thickness, thereby affecting the physical and electrical properties of the final coated product, such as its corrosion resistance and electrical conductivity. In the past, it has sometimes occurred that producers of the coated materials have had to recoat the product after rejecting it for not having passed their own in-house quality control tests, or more embarrassingly, after rejection by their customers as being off specification and unacceptable for the intended end use. Both situations are costly to the producer, either in an economic sense or from the perspective of negatively affecting their business reputation.

Other earlier processes have the disadvantage of requiring the formation of suspensions or chelates of the precious metal ions, or suspensions of the substrate material, or both, and effect the coating reaction by a complex and messy gel-forming reaction. Still others have the disadvantage of requiring the addition of special additives to the substrate or to the plating solution bath in order to achieve a more acceptable quality of coated product.

The single greatest disadvantage of all of the earlier processes, however, has been the fact that they have been based on a single coating step in which the total amount of noble metal to be deposited is provided in one plating solution bath. Such processes present difficulties with respect to their capability of consistently producing uniformly coated product of high quality.

When the entire coating is effected in a single step, there is a tendency for uneven coating of all the substrate particles to occur. Some particles of the non-noble metal substrate can become coated with more than the desired amount of noble metal, while other particles of the substrate may be only partially coated or even completely uncoated. The latter is especially true when the substrate is a fine powder, having a large surface area.

Some of the parameters that play a major role in affecting the extent of coating of the substrate particles include the concentration of the noble metal ions in the plating solution bath; the size of the substrate particles; the homogeneity of the mixing and distribution of the substrate particles in the plating solution bath; the cleanliness and state of activation of the the substrate material; and the efficiency of mixing and degree of contact between substrate particles and noble metal ions in the plating solution bath.

Where the substrate is a fine powder, local cohesive forces between powder particles may be sufficiently strong that they cannot be overcome when in the plating solution bath, causing clumping of the substrate particles. These clumps may remain even after stirring of the particles in the bath. When such clumps form, the outer surface of the particles to the center of a clump remains shielded against plating by the noble metal ions. Some have attempted to overcome this problem by introducing dispersing agents with the substrate material, however, this alone does not completely overcome the problem, and, in fact, may create other problems by introducing other chemical compounds into the plating solution baths. Care must be taken that the dispersing agent itself is chemically unreactive with respect to the precious metal and that it does not interfere with the coating process.

When coating is performed as a single step, there is also a tendency for any impurities in the plating solution bath to co-deposit on the surface of the substrate, together with the noble metal ions. These impurities may then prevent the subsequent plating of noble metal ions if the noble metal ions have little affinity for the surface of the impurities in comparison to the clean activated surface of the substrate itself. In such cases, the surface of the final product is an essentially noble metal coating interspersed by impurities. Depending on the nature and extent of the impurities, this phenomenon can greatly affect the physical and electrical properties of the final coated product. If the amount of impurities on the surface is large and of a nature as to adversely affect the corrosion resistance and electrical conductivity of the material, the entire batch of coated product will be off specification and unusable.

For example, the surface impurities may act as local sites at which oxidation or corrosion of the material can begin to occur. The impurities can also adversely change the electrical conductivity of the coated material.

Alternatively, impurities in the plating solution bath may first deposit on the substrate surface and subsequently become coated with noble metal, as long as the noble metal ions in the plating solution bath have sufficient affinity for coating the surface of the impurity. Where the bonding or surface adhesive forces between the substrate and the impurity or between the impurity and the noble metal which subsequently coats it are not as great as exists between the substrate and the the noble metal itself, however, the coated product is susceptible to failure from several possible causes. The noble metal coating may abrade from the impurity leaving an exposed impurity or the noble metal-bearing impurity may become abraded from the substrate surface itself, leaving exposed substrate material. Depending on the nature of the impurity or the substrate material and the extent of the defect, either of these situations can have a significant effect on the properties of the coated product, possibly rendering it off-specification and unusable.

Degradation of materials containing such defects after incorporation in a finished product such as an electromagnetic shielding material is also more likely and can cause failure of the ultimate product. These defects can have a significant negative effect on the electrical conductivity of the material. Defects in the coated surface, either as impurities or exposed substrate, can themselves cause product failure by affecting the electrical properties of the coated material, or they can act as localized sites at which oxidation or corrosion may begin, ultimately leading to a change in the physical and electrical properties of the material and failure of the product in which the coated material has been incorporated. For example, exposed copper substrate is highly susceptible to corrosion if exposed to air or another oxygen-containing atmosphere.

Accordingly, it is an object of the present invention to teach a process that substantially eliminates all of the aforesaid problems inherent in previous processes requiring the formation of various suspensions or complexes, the formation of intermediate metal coating layers, the addition of special additives to promote the coating process, the use of combined immersion and electroplating techniques, or, generally, the use of only a single immersion coating step to effect coating of the precious metal, and which assures the consistent production of uniformly high quality coated product through the use of a multi-step coating process, with intermediate and final product rinsing steps.

The present invention is a significant improvement in and major contribution to the state of the art of preparing noble metal coated products in that it has been discovered as a result of extensive experimentation and testing that the aforesaid problems inherent in single plating step processes are overcome and high quality coated product of uniform consistency and long term stability is produced utilizing a coating process comprising a plurality of coating steps to plate-out the total desired amount of noble metal onto the substrate, with each of the individual plating steps being followed by a series of washing steps and a further series of washing steps being performed after the last step of the washing sequence following the final plating step.

SUMMARY OF THE INVENTION

In accordance with the invention, an improved process for plating a coating of a noble metal onto a non-noble metal substrate, especially for plating silver onto copper, nickel and aluminum, is provided. A further object of the invention is to provide such a coated material wherein the particles of the substrate are coated in an economical, efficient and rapid manner and the coated particles exhibit high quality, highly uniform consistency and a high degree of stability and reliability. Another object of the invention is to provide a mass of noble metal coated non-noble metal particles which exhibit electrical properties substantially like solid particles of noble metal, but which effect a considerable saving in the amount of noble metal utilized. A still further object of the invention is to provide a mass of noble metal coated non-noble metal particles which can be produced as an adhesive, dispersion, paint, conductor or wire for printed circuits, a material for joining members by soldering or welding, and a material which can be incorporated into a plastic or resin matrix for use as an electromagnetic shielding material.

The process of the present invention comprises preparing an aqueous plating solution containing free ions of the noble metal; activating the non-noble metal substrate where required by removing any metal oxide coating on the substrate which prevents uniform coating; immersing the activated substrate in a plurality of at least two baths of the plating solution to coat the substrate with the metal ions to a predetermined depth; washing the intermediately coated and final coated substrate with water; next washing the final coated substrate with at least one series of rinses comprising a first rinse with water, a rinse with a weak acid, a second rinse with water, and a rinse with an alcohol; and finally rinsing the final coated substrate from one to three times in succession with water and from one to three times in succession with an alcohol.

The post-plating rinsing steps have been found to impart to the final coated product consistently superior characteristics than have heretofore been obtainable with other immersion coating processes which do not include the series of rinsing steps. These series of steps, in combination with the use of a plurality of coating steps, have been discovered to be responsible for the final coated product having excellent electrical conductivity, uniformity of coating and long term operational stability.

DETAILED DESCRIPTION OF THE INVENTION

Figure 1:
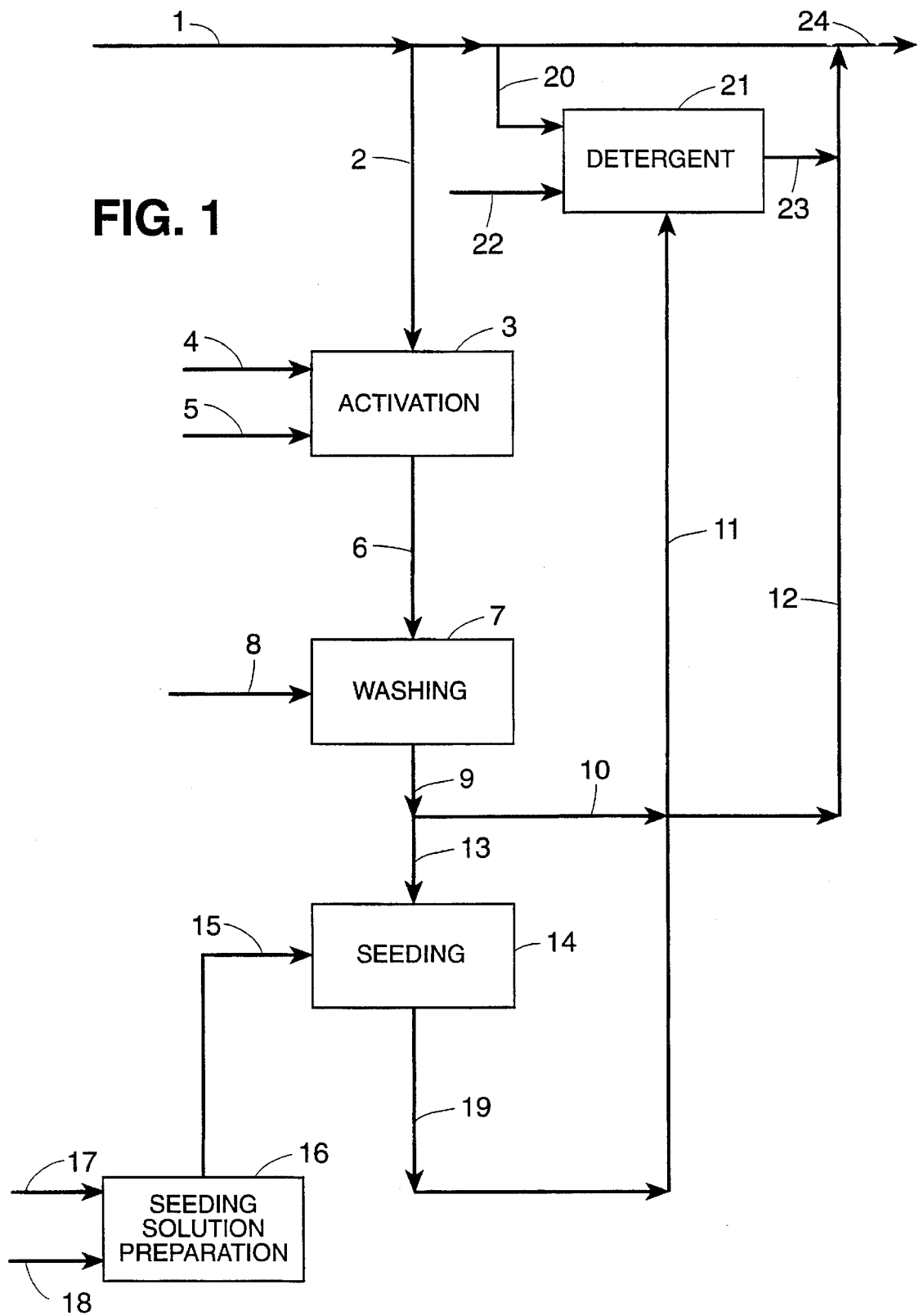
FIG. 1 is a generalized block flow diagram of the optional substrate material activation and pre-treatment steps of the process of the invention.

As used herein, the terms coating and plating, and their respective derivative forms, are used interchangeably and refer to the deposition of the noble metal on the non-noble metal substrate by an electro-less process wherein the substrate is immersed in a bath containing free ions of the noble metal to produce a layer of the noble metal on the non-noble metal substrate. Similarly, the terms noble metal and precious metal are used interchangeably, and refer to silver, gold, platinum and other valuable transition elements of the periodic table. The terms rinse and wash are used interchangeably in referring to the various inter- and post-plating steps wherein the coated product is contacted with various liquids as described in detail below.

The process of the present invention involves a multi-step process of immersion coating a metallic powder in a bath of noble metal-containing plating solution.

Noble metals which are platable according to this process include gold, silver, platinum, palladium, iridium, rhodium, ruthenium and osmium. Gold and silver are particularly commercially significant.

Non-noble metal substrates onto which the noble metal is plated according to this process include copper, nickel, aluminum, titanium, zirconium, vanadium, hafnium, cadmium, niobium, tantalum, molybdenum, tungsten, gallium, indium, thallium and the like. Also included are combinations of one of the above substrates seeded with atoms of another one of the substrates having a greater affinity for the noble metal plating material than the principal substrate material. Copper, nickel, aluminum and copper-seeded aluminum are especially preferred and of greatest commercial significance. Titanium and zirconium are also of commercial significance.

It has been found that the process works particularly well for the plating of silver onto copper, silver or gold onto nickel and silver onto copper-seeded aluminum.

The non-noble metal substrate onto which the noble metal is plated is preferably in the form of a powder. The particles of the powder can be in a variety of shapes, including spheres, rods, or flakes. It has been found that the best results are obtained when the particles of the powder have a spherical shape. The plating of the noble metal has been observed to be more uniform when spherically shaped powders are used. In the case of plating silver onto nickel powder, it is especially preferable that the powder particles be spherical in shape.

The powders utilized as the substrates according to this invention have a surface area of from 15–750 sq. ft/lb. The particles of the powder should have a minimum size of 0.5 microns.

The first step of preparing the plating solution involves a determination of how much noble metal is required to produce the desired coating. Because it is difficult to measure the thickness of the coating on micron sized powder particles, it has long been the standard to measure the amount of coating deposited on the substrate material as a weight percent of the total weight of final coated product.

Accordingly, with the process of the invention it is possible to produce coated products having from approximately 2 to 60 weight percent noble metal coating on the substrate material. Coatings amounting to less than about 2 weight percent of the total weight of product tend not to have completely and uniformly coated substrates, particularly when the substrate particles being coated have large volume and high surface area with respect to their weight. Coatings greater than about 60 weight percent of the total weight tend to be undesirable in that at such high coating weights, the physical strength of the coated particles begins to be negatively affected and the coating material tends to easily abrade. Furthermore, higher coating weights of noble metal do not serve to enhance the electrical properties of the coated material and are wasteful of the more expensive noble metal.

The first step of the process of the present invention involves the preparation of a master plating solutionwhich is substantially an aqueous solution containing the total amount of free ions of the noble metal ultimately desired to be coated onto the substrate.

There are a number of procedures for producing free noble metal ion-containing aqueous solutions, that are known to those skilled in the art. The following describes one known method preferred for use in conjunction with the process of the present invention. Other methods of effecting dissolution of a noble metal-containing compound in aqueous solution to generate a desired quantity of free noble metal ions therein, for use as the master plating solution, may be utilized and will be apparent to those skilled in the art.

Generally, the master plating solution is prepared by dissolving in water a compound of the noble metal desired to be coated onto the substrate, such as a cyanide, chloride, or nitrate salt of the noble metal, or preferably, an oxide of the noble metal. Because the cyanide, chloride and oxide compounds of most noble metals range from being only slightly soluble to insoluble in water, it is generally necessary to add an amount of one or more compounds to the aqueous solution to act as an agent for promoting and enhancing dissolution of the noble metal compound, so as to generate the required amount of free noble metal ions in solution that will produce the amount of noble metal coating on the substrate through the individual coating baths. The cyanide, chloride and oxide forms of most noble metals are soluble in cyanide-containing solutions. When the noble metal is not gold, an alkali metal cyanide, which is itself readily soluble in water, is used as the agent for promoting dissolution of the noble metal compound in water. Potassium and sodium cyanide are the preferred forms of alkali metal cyanide. The amount of alkali metal cyanide used is from about 1.5 to 2.5 times the weight of the noble metal compound providing the free noble metal ions.

Preferably, the water for the master plating solution is at or near the boiling point. The alkali metal cyanide is slowly and carefully added to the boiling water before the non-gold noble metal compound is introduced into the aqueous, cyanide-containing solution, with constant stirring.

The nitrate compounds of most noble metals are generally significantly more soluble in water than the cyanide, chloride or oxide forms. Therefore, when a nitrate salt of a non-gold noble metal is utilized as the source of the noble metal ions for the master plating solution, little or no promoting agent is required to generate the desired amount of free noble metal ions in solution.

Where the noble metal to be coated onto the substrate is gold, supplied as any form of gold compound, but particularly as gold-potassium cyanide, it is known to those skilled in the art to substitute for the use of an alkali metal cyanide as a dissolution-promoting agent, the use of an amount of at least one of ammonium chloride, sodium citrate and sodium hypophosphate. Preferably, a mixture of all three compounds in a weight ratio of ammonium chloride to sodium citrate to sodium hypophosphate of from about 7.0–8.0:4.5–5.5:1 is used. When utilized as a mixture in this ratio in the process of the present invention, the overall amount of mixture added to the water of the master plating solution, prior to addition of the gold-containing compound, is such that the weight of sodium hypophosphate is from about 2.0–2.5 times the weight of the gold-containing compound utilized.

For environmental reasons, it is generally preferred to utilize the noble metal oxide form of the noble metal in preparing the master plating solution to minimize the amount of cyanide in the plating solution.

Where the non-noble metal substrate to be plated is one which oxidizes, such as aluminum, the process includes a step to remove the oxidation film so as to activate the metal substrate whereby the noble metal being plated onto the substrate will adhere uniformly to the substrate. The presence of an oxide coating on the substrate prevents good adhesion of the plating metal.

Deoxidation of the surface of the substrate, where required, is performed by any of a number of techniques known in the art. It has been found that washing the substrate with an aqueous solution of an alkali metal cyanide is a particularly effective method of removing an oxide coating from the surface of the substrate.

It has also been discovered that the plating process itself is much improved by mixing a liquid detergent with the particles of substrate material prior to immersing the substrate in the plating solution baths. The liquid detergent acts as a cleaning and brightening agent, and also serves to moderate the speed of the plating reaction and reduce or prevent foaming. It has been found that while the use of a liquid detergent is not essential to the plating of silver onto copper, it is very helpful in the plating of silver onto a nickel substrate, and is essential for the plating of silver onto aluminum.

In the case of plating a noble metal onto aluminum, it has been discovered that plating is greatly facilitated and the quality of the resulting product greatly improved when the aluminum substrate material is first seeded with atoms of another substrate material which is less oxidizable and for which the plating metal ions have a greater affinity. It is preferred to use copper as the seeding material for an aluminum substrate material. The seeding material is readily introduced into the substrate material by washing the substrate with a solution containing ions of the seeding material. Aluminum substrate material is effectively coatable when the amount of seeding material is less than 0.01 weight percent of the substrate. The seeding material can be as low as 0.001 weight percent of the substrate.

It has been found that in order to obtain the greatest possible uniformity of coating, it is preferable that the plating actually be carried out utilizing a plurality of coating steps sequentially performed using a fresh plating solution which is a fraction of a starter master plating solution bath containing the total amount of noble metal to be plated. Where a plurality of plating steps are utilized, the total amount of noble metal ions to be deposited, as calculated from consideration of the total weight of coating to be applied is divided amongst the total number of plating baths by taking the required fraction of the starter plating solution and appropriately diluting each portion to give the desired concentration.

It has been found that optimally from two to five plating steps are generally sufficient to produce a uniform coating of the noble metal on the substrate to whatever weight of coating is desired. At least two steps, with intermediate rinsing steps are required to produce a uniform coating and to eliminate the problems of deposition of impurities that occur with single plating step processes. It is not necessary to have more than five plating steps with intermediate rinsing steps. A diminishing return in terms of increased process costs for insignificant improvement in the quality of the coated product occurs beyond five plating steps.

The optimum number of plating steps for a particular plating situation is a function both of the nature of the substrate material and the total amount of noble metal coating being applied. The amount of noble metal to be plated in any given plating step of a multi-step process does not have to be the same, although it has been found that for most substrate materials an equal division of the total amount of noble metal among each of the plating solution baths produces high quality product. Thus, it has been discovered that the optimum number of plating solution baths for plating silver or gold, particularly, a total silver or gold content of from about 15–25 weight percent, onto a nickel powder substrate is 4, with each bath containing 25% by weight of the total amount of silver or gold. Similarly, for the case of plating silver or gold, particularly, a total silver or gold content of from about 15–25 weight percent, onto a copper-seeded aluminum powder, it has been determined that 2 plating solution baths, each containing 50% by weight of the total amount of silver or gold produces optimum results. For plating silver or gold, particularly a total silver or gold content of from about 15–25 weight percent, onto copper powder, however, it has been determined that 5 plating solution baths is the optimum number required to produce a uniformly coated product. For this case, however, it has been determined that the optimum results are produced when the fraction of the total amount of silver or gold being plated is approximately 80 percent of the total amount by weight for the first plating solution bath; approximately 16% for the second bath; approximately 3.2% for the third bath; and approximately 0.4% for each of the fourth and fifth baths.

According to the present invention, the plated substrate is rinsed with a first series of rinse steps after completion of each intermediate plating step as well as after the final plating step. It has been found that these washing steps, together with the feature of plating the noble metal in a plurality of coating steps, greatly improves the quality and consistency of the product. It is believed that the rinse steps contribute to the high quality, uniformity and stability of the coatings by acting to remove trace amounts of impurities which have plated-out on or have become adhered to the substrate material in the preceding plating step, thereby preventing the accumulation of impurities which would be coated-over in subsequent plating steps, or as would immediately be coated-over in single plating bath processes, a major factor responsible for poor quality product and contributing to product failure in service.

The intermediate and final first series of rinse steps involve the simple washing of the intermediately or finally coated substrate with water. It is preferred to use distilled, demineralized and purified water to prevent the introduction of new impurities in contact with the coated substrate material. It has been found that two consecutive water rinses are the optimum number of rinse steps in each sequence for all cases of coating material and substrate. It has been further found that the temperature of the water rinses is, however, a factor affecting the efficiency of the wash and the ability to remove impurities. The optimum temperature moreover has been found to vary with the nature of the coating material and substrate. Accordingly, it has been found that for the case of plating silver onto a copper substrate, optimum rinse efficiency is achieved by using first a warm water rinse followed by a hot water rinse for the second rinse of each two-rinse sequence. Similarly, for the case of plating silver onto a nickel substrate, optimum rinse efficiency is achieved using a hot water rinse for each of the first and second rinse steps of each two-rinse sequence. In the case of plating silver onto a copper-seeded aluminum substrate it has been found that optimum rinse efficiency is achieved using a cold water rinse for each of the first and second rinse steps of each two-rinse sequence. In addition to the post-intermediate plating step and post-final plating step first sequence of rinse steps, it has been found that performance of a second sequence of rinse steps after completion of the last step of the post-final plating step first rinse sequence further improves the quality, consistency and stability of the final coated product.

The second sequence of rinse steps is a four step series of consecutive rinses; first, with water, preferably distilled, demineralized and purified hot water; second, with a weak aqueous acid solution, preferably a 25% by volume glacial acetic acid aqueous solution; third, again with water, as in the first step of the sequence; and fourth, with an alcohol, preferably methanol. Other weak acids which can be utilized in the second rinse step of the sequence include dilute aqueous solutions of hydrochloric acid, nitric acid and hydrazine. Other alcohols which can be utilized in the fourth rinse step of the sequence include all lower alkanols having from 1 to 4 carbon atoms.

It has been found that the above series of rinses is an optimum for the second sequence of rinse steps for all cases of noble metals and substrate materials. Although it has been found that optimum rinsing efficiency with the first and third water rinse steps is achieved in all cases using hot water, the second, acidic and fourth, alcohol rinse steps can effectively be carried out using the respective acid and alcohol solutions at essentially room temperature. The complete sequence of four rinse steps should be performed from one to four times in succession. It is particularly preferred to repeat the second rinse step sequence of four rinse steps the full four times.

It is believed that the second sequence of rinse steps performed after the last water rinse step of the first sequence following the last plating step contributes to the overall quality, consistency and stability of the final coated product by removing any remaining traces of impurities which may have been introduced in the plating solution baths or which may have originally been present on the substrate material and which remained after any cleaning and deoxidation of the substrate. The rinse steps also appear to fix the plated noble metal by leaving a thin coating which helps the coated product resist oxidation.

It has been found that the best final coated product is obtained where yet one more sequence, that is, a third sequence, of rinse steps is performed on the coated product after completion of the last repetition of the four step second sequence of rinse steps.

The third sequence of rinse steps includes a washing of the coated product first from one to three times in succession with hot water, followed by washing from one to three times in succession with an alcohol. The alcohol can be any lower alkanol having from 1 to 4 carbon atoms. It is preferred to use methanol. It is preferred to perform the full three washings with hot water, followed by the full three washings with the alcohol.

After completion of the last step of the third wash sequence, the final coated product is dried. Drying of the product can be effected by any one of air drying at room or elevated temperature, vacuum drying, washing with acetone, or a combination of the above. It is preferred to first wash the product with acetone, followed by drying at room temperature.

The process of the present invention may be more fully understood with reference to the accompanying drawings and the following process description.

According to FIG. 1, non-noble metal substrate material entering in line 1 is first pretreated, as required, depending on the nature of the substrate, for subsequent plating with noble metal. Where the nature of the substrate material is such that it does not require pretreating in the form of activation to remove any oxide coating; seeding with atoms of another metal which is more readily coated to facilitate plating; or mixing with detergent to improve the uniformity of the plated noble metal on the substrate material, the substrate material from line 1is sent directly to the first plating solution bath in line 24.

Where, however, the nature of the substrate material is such that it readily forms an oxidized layer on its outer surface, such as is the case with an aluminum powder substrate, the substrate must first be activated by treatment in activation step 3. The substrate material is sent to the activation step in line 2. The chemicals used to activate the metal generally include an aqueous solution of an alkali metal cyanide supplied in line 4, and sodium hydroxide supplied in line 5. A small amount of detergent may also be added to help clean, degrease and deoxidize the substrate in step 3. The activated substrate leaving the activation step 3 in line 6 is then washed in step 7 with water supplied in line 8.

It has been found that most substrates which require activation also coat better when mixed with a small amount of a detergent prior to immersion in the plating solution baths. The washed, activated substrate in line 9 is then sent via lines 10 and 11 to detergent mixing step 21 to be mixed with detergent. Even where the substrate material does not require activation because an oxidation layer does not readily form on its outer surface, it has been found that it may nevertheless be desirable to mix a small amount of detergent with the substrate in order to promote more uniform plating. Thus, substrate entering in line 1, may alternatively be sent via line 20 to detergent mixing step 21 to be directly mixed with some detergent supplied in line 22 to form a paste of the substrate material supplied from line 1 and the detergent supplied from line 23. The substrate-detergent paste in line 23 is then sent to plating via line 24. If it is not desired to mix the washed activated substrate material from line 10 with detergent before plating, the detergent mixing step 21 can be bypassed using bypass line 12 and the washed substrate from line 10 can be sent directly to the first plating solution bath via line 24.

For certain substrate materials, particularly aluminum, it has been found that plating with the noble metal proceeds better when the substrate has been seeded with atoms of another metal for which the noble metal has a greater affinity. Thus, in the case of an aluminum substrate, it has been found that noble metal coating is much improved when the aluminum substrate has been seeded with atoms of copper. For such cases, the activated and washed substrate material leaving the washing step 7 by line 9 is seeded in seeding step 14 with atoms of the seeding material introduced in the form of a seeding solution in line 15 prepared in seeding solution preparation step 16. The atoms of the seeding material are introduced through line 15 in the form of a water soluble salt of the seeding material, such as copper sulfate, for the case where the seeding material is copper atoms. Water is supplied by line 18. Additionally, ammonium hydroxide and potassium cyanide can be added to the seeding solution to maintain the atoms of the seeding material free in solution.

Figure 2:
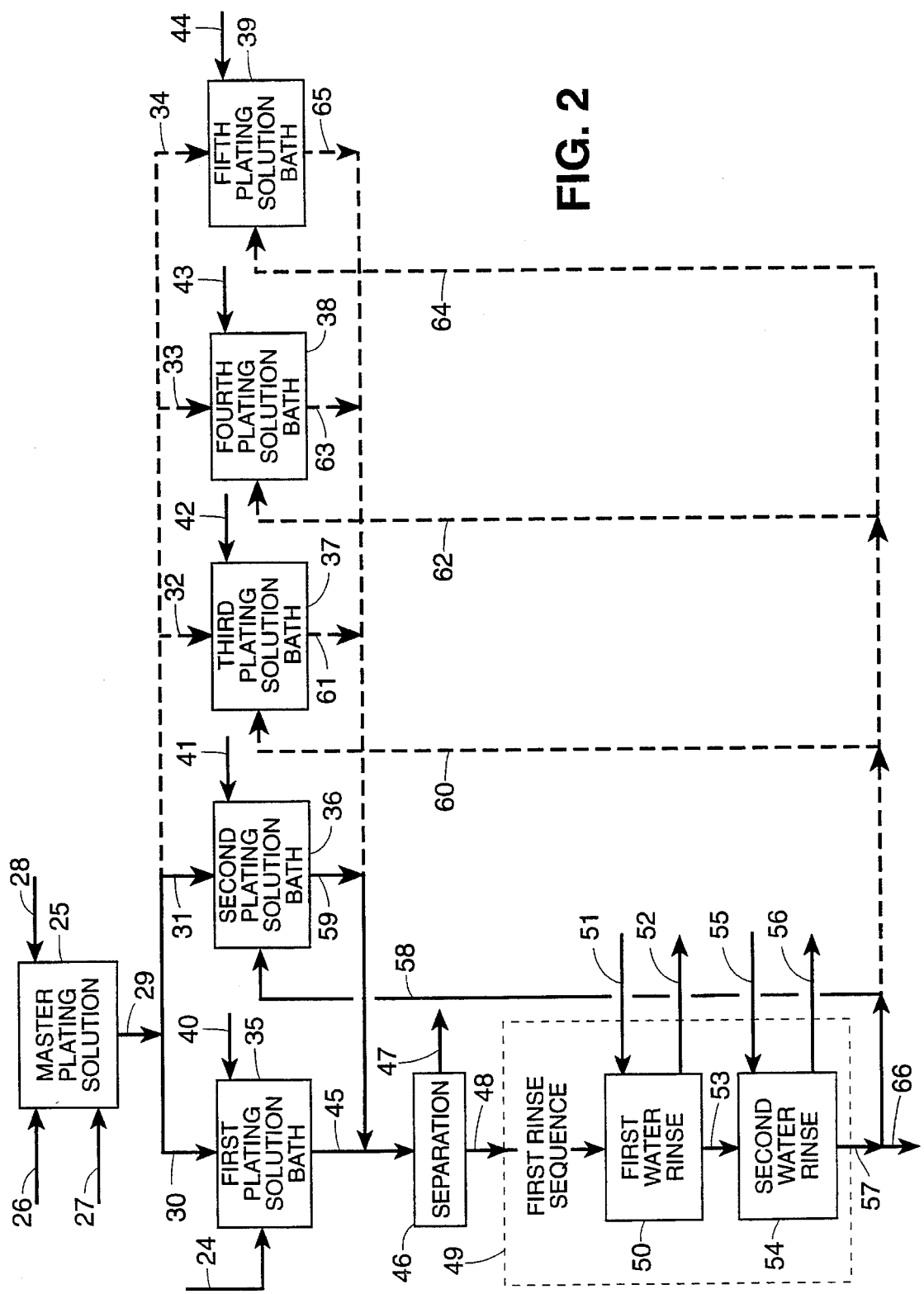
FIG. 2 is a generalized block flow diagram of the master plating solution preparation, plating, separation and first rinse sequence steps of the process of the invention.

Referring to FIG. 2, a master plating solution is prepared by determining the total requirement of noble metal to be plated based on a consideration of the desired weight percent of noble metal on the final coated product and the weight of substrate material to be coated. Accordingly, the desired amount of noble metal-containing compound in the form of a cyanide, chloride or nitrate salt of the noble metal, or preferably, an oxide of the noble metal, is sent to master plating solution preparation step 25 via line 26, where it is mixed with water entering in line 28. Where the noble metal is not gold, and the compound utilized is the cyanide, chloride, or oxide form, which generally range in being from only slightly soluble to insoluble in aqueous solution, an amount of an alkali metal cyanide, such as potassium or sodium cyanide, is added to promote dissolution of the noble metal-containing compound, and to keep the ions of noble metal supplied by the dissolved salt or oxide free in solution. The cyanide, chloride and oxide compound forms of noble metals are generally significantly more soluble in cyanide-containing solutions. The alkali metals, which are soluble in water, readily dissolve to supply the cyanide ions in the aqueous solutions, which in turn enable the noble metal containing compounds to dissolve more easily. Where the noble metal to be plated is gold, supplied in any of the selectable forms of gold-containing compounds, an alkali metal cyanide, however, is not used. Where a non-gold noble metal is supplied in the form of a nitrate salt of the noble metal, the addition of little or no alkali metal cyanide is required, since the nitrate salts are generally more soluble in aqueous solution than the other forms. Where the noble metal to be plated is gold, supplied in any of the forms of gold compound utilizable according to the process of this invention, dissolution of the gold-containing compound is promoted by the addition to the aqueous solution of an amount of at least one of ammonium chloride, sodium citrate and sodium hypophosphate, in place of an alkali metal cyanide. Preferably, a mixture of all three is added to the gold compound/water plating solution bath to promote dissolution of the gold compound. A mixture containing the three compounds in a weight ratio of ammonium chloride to sodium citrate to sodium hypophosphate of from about 7.0–8.0:4.5–5.5:1 is most preferred. When utilized in this ratio, the weight of sodium hypophosphate utilized is from about 2.0–2.5 times the weight of the gold-containing compound.

Individual plating solution baths are then prepared from the master plating solution. A determination of the optimum number of individual plating solution baths, ranging from 2 to 5, for the given combination of substrate material and noble metal being plated is first made. For the plating of silver or gold onto a copper substrate over the range of weight percent of noble metal in the final coated product according to this invention, it has been found that the use of a full five plating solution baths results in the best product. For the case of plating silver or gold onto a nickel substrate over the range of weight percent of noble metal in the final coated product according to the invention, it has been found that four plating solution baths produces optimum coated product. For the plating of silver or gold onto a copper-seeded aluminum substrate over the range of weight percent of noble metal in the final coated product according to the invention, it has been found that two plating solution baths are sufficient to consistently produce high quality coated product. The optimum concentration of each plating solution bath is then determined. The portion of the total amount of noble metal being plated onto the substrate to be plated in each of the determined number of baths ranges from a fraction of a percent to approximately 80 percent, depending on the nature of the noble metal and substrate materials and the number of plating steps. Thus, in the case of plating silver or gold onto copper, where it has been determined that five plating solution baths provides optimum coating, it has further been determined that the first bath should contain approximately 80 percent of the total dissolved noble metal ions from the master plating solution; the second bath should optimally contain approximately 16 percent of the total weight; the third bath should contain approximately 3.2 percent of the total weight; and the fourth and fifth plating steps are reserved as final "touch-up" plating steps, with each containing about 0.4 percent of the total weight of noble metal ions in the master plating solution. For the cases of plating silver or gold onto nickel or copper-seeded aluminum substrates, it has been found that equal division of the total amount of noble metal ions in the master plating solution amongst the optimum number of individual plating solution baths results in coated product having excellent properties. Thus, in the case of plating silver or gold onto a nickel substrate, each of the four baths preferable contains 25 percent of the total noble metal free ions from the master plating solution. In the case of plating silver or gold onto a copper-seeded substrate, each of the optimum two individual plating solution baths each contains 50 percent of the total noble metal ions in the master plating solution. The above examples of particular optimum conditions for several cases of coated materials prepared according to the process of this invention are not intended to be limiting. The process of the invention generally produces consistently high quality coated product over a broad range of combinations of the number of plating solution baths and their individual concentrations for all cases of substrate material and noble metal. Other optimum combinations of parameters are readily determinable by those skilled in the art.

With this in mind, the master plating solution in line 29 is divided into from two to five individual plating solution bath feedstocks in lines 30, 31, 32, 33, 34, which are sent to the respective first through fifth plating solution bath preparation steps 35, 36, 37, 38, 39. Water is added to each of the baths via lines 40, 41, 42, 43, 44, respectively, to increase the volume of the solution and bring it to the proper concentration for plating.

The substrate material, which may have been pretreated as required, according to the steps in FIG. 1, previously described, enters the first plating solution bath via line 24, where coating of the noble metal in that solution is effected until the plating solution is substantially depleted of free noble metal ions. The intermediately plated product, prepared in the first plating solution bath, leaves through line 45 and is then separated from the lean plating solution liquor in separation step 46. The lean plating solution liquor is sent to appropriate waste treatment or disposal via line 47.

The intermediately plated substrate material leaves the separation step in line 48 and is then treated with a first rinse sequence of steps 49. The coated substrate in line 48 is sent to a first water rinse step 50, where it is washed with water supplied in line 51. The rinsed coated substrate material is separated and leaves in line 53. The rinse water is removed in line 52 and is sent to appropriate waste treatment or disposal. The coated substrate in line 53 is then sent to a second water rinse step 54, where it is washed a second time with water entering in line 55. The rinsed coated substrate material is separated and leaves in line 57. The second rinse water is removed via line 56 and is also sent to appropriate waste treatment or disposal.

The washed, intermediately plated substrate from the first plating step is then sent in line 58 to the second plating solution bath 36, where further plating of the substrate material occurs until the second plating solution is substantially depleted of noble metal ions. The further plated substrate material and lean plating solution liquor are then removed from the second plating bath in line 59 and separated in separation step 46, which is repeated exactly as described above following the first plating step. The two steps 50,54 of the first rinse sequence 49 are then also repeated for the further coated substrate from the second plating step. The washed, further coated substrate material leaves in line 57.

Depending on whether there are any additional third through fifth plating steps remaining, the substrate material is sequentially sent to such respective plating solution baths 37, 38, 39, via lines 60, 62, 64, respectively. The further coated substrate material and lean plating solution liquor substantially depleted of free noble metal ions from each of the third through fifth plating steps, is removed from the respective bath in lines 61, 63, 65 and sent to separation step 46 and steps 50 and 54 of first rinse sequence 49, where the separation of the substrate from the lean liquor and the two water rinsing steps are respectively performed.

After completion of the above sequence for the final plating step, the final plated substrate is sent to the second rinse sequence in line 66.

Figure 3:
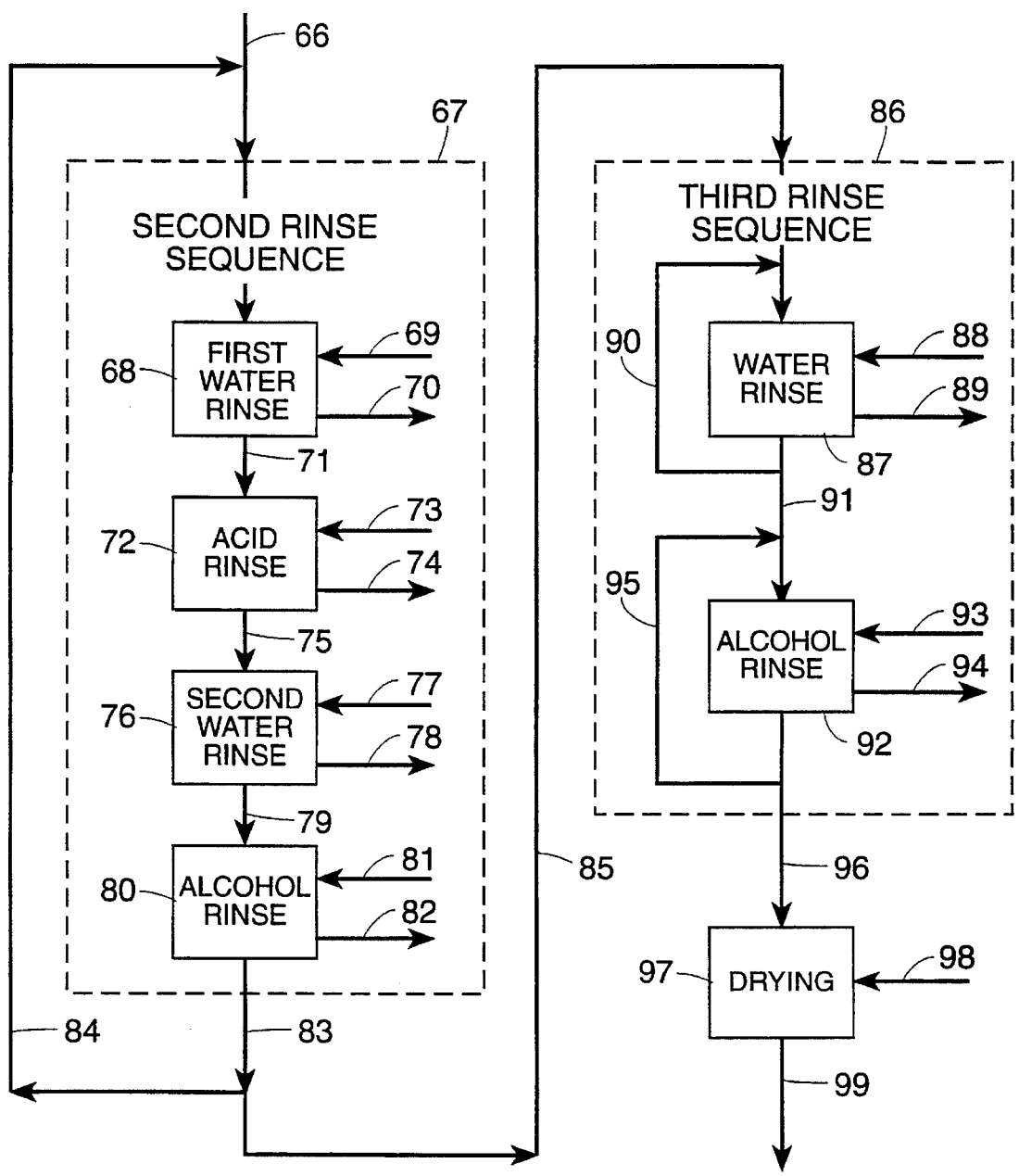
FIG. 3 is a generalized block flow diagram of the second and third rinse sequence and drying steps of the process of the invention.

According to FIG. 3, the final coated substrate material from the water rinse step 54 of first rinse sequence 49 following completion of the last plating step is sent in line 66 to second rinse sequence 67, where the four separate rinse steps 68, 72, 76, 80 of the sequence are sequentially performed.

The substrate material in line 66 is first washed with water in first water rinse step 68. Rinse water is supplied in line 69. The rinse water is separated from the coated material and is sent to appropriate waste treatment or disposal in line 70. The washed coated substrate material in line 71 is then washed with a weak acid in acid rinse step 72. The weak acid, preferably a 25% by volume aqueous glacial acetic acid solution, is supplied in line 73. The acid solution is separated from the coated material and is sent to appropriate waste treatment or disposal in line 74. The acid-washed coated substrate material in line 75 is then washed a second time with water in second water rinse step 76. Rinse water is supplied via line 77. The rinse water is separated from the coated material and is sent to appropriate waste treatment or disposal in line 78. The water-washed coated substrate material leaving the second water rinse step in line 79 is finally washed with an alcohol in alcohol rinse step 80. The alcohol, containing from 1–4 carbon atoms, preferably methanol, is supplied in line 81. The alcohol is separated from the coated material and is sent to appropriate waste treatment or disposal in line 82. The complete four-step second rinse sequence is performed a total of from one to four times. Recycle line 84 represents the repetition of the second rinse sequences. The final washed coated substrate after alcohol rinse leaving in line 83 is returned to the first water rinse step 68 and the entire sequence as just described is repeated the desired number of times. Preferably, the sequence is performed a total of four times. The final washed coated product material after completion of the last step of the last repetition of the second rinse sequence is then sent, in line 85, to the third rinse sequence 86, where a two step sequence of washing the final coated substrate material first with water, in water rinse step 87, followed by washing with alcohol, preferably methanol, in alcohol rinse step 92, is performed. The alcohol is separated and withdrawn in line 95. Both the water rinse step of the sequence and the alcohol rinse step of the sequence can each be performed from one to three times. All water rinse steps are completed before the alcohol rinse step or steps are performed. The provision for repetition of the washing steps is shown by recycle lines 90 and 95, respectively.

The final coated product in line 96, after completion of the last rinse step of the third rinse sequence, is lastly sent to drying step 87, where the final, washed coated substrate material is dried by one of physical means, such as air drying or vacuum drying; or by chemical means, such as by washing with acetone; or by a combination of those methods. The physical or chemical drying agent, if such is utilized, is introduced into the drying step via 98.

The final washed, coated product 96 is then dried according to any one of various drying steps, and is withdrawn in line 99 as the final washed, coated product.

It will be apparent to those skilled in the art that the process of this invention can readily be carried out in a plurality of ways, including on a batch, semi-batch or continuous basis, utilizing appropriate equipment in each case. Similarly, the scale of production of coated product is flexible, ranging from the order of magnitude of several grams of product on a semi-micro scale to several hundreds of pounds on a commercial scale. The particular manner of carrying out the process is generally determined in part by the scale of the operation, with semi-micro scale quantities generally being produced on a batch or semi-batch basis and commercial scale quantities being produced on a larger semi-batch or continuous processing basis. It will be further apparent to those skilled in the art that while the foregoing process description is written for a commercial scale semi-batch basis, the steps are identical for other bases, although the equipment utilized will be different and not as complex. Thus, for example, in production on a batch basis, separation of coated product from lean plating solution liquor may occur by simple decantation of the liquor from the coated substrate in the plating vessel, which may simply be a beaker. Similarly, on a batch basis, reference in the foregoing process description to transport of the various materials through numbered lines will be understood generally to simply represent the act of pouring or mixing the indicated components.

The coated substrates produced in accordance with the foregoing have utility in a wide variety of applications requiring electrically conductive materials or electromagnetic interference shielding materials. Because of the superior physical and electrical properties of electrically conductive noble metal coated non-noble metal substrate powders produced in accordance with the present process, it has been found that the properties and functional performance of the conductive materials and shielding materials incorporating such coated powders are surprisingly significantly superior to those of similar materials fabricated utilizing noble metal coated non-noble metal powders produced according to previously known methods.

When used in the fabrication of electromagnetic interference shielding materials, the coated powder produced according to the present process are incorporated into a resin or plastic matrix. The materials have a composition of from about 80–90 weight percent coated powder and from about 10–20 weight percent matrix material.

The matrix material in which the noble metal coated non-noble metal substrate powder is dispersed can be a rubber, a plastic material, an elastic material, or a mixture of such materials. Preferred types of elastic materials include silicone, fluorosilicone, and polyisobutylene elastomers. Preferred types of plastic materials include polyamides, acrylics, urethanes and polyvinyl chloride silicone plastic. Electromagnetic interference shielding materials wherein the noble metal coated non-noble metal is aluminum seeded with copper and coated with silver, or is silver or gold on a nickel substrate, are new.

Other types of useful electrically conducting materials utilizing the noble metal coated, non-noble metal substrate powders produced according to the present process include an electrically conducting thermosetting plastic based on polyamine and diisocyanate; an electrically conductive material based on a copolymer matrix of at least one compound of chlorinated biphenyl and triphenyl, amorphous polypropylene, ethylene, vinyl acetate, phenol, formaldehyde, and terpine; an electrically conductive adhesive material based on chlorinated biphenyl and triphenyl, and amorphous polypropylene; and an electrically conductive material based on polyamide resin and epoxy.

The features of this invention may be more fully understood with reference to the following non-limiting examples which set forth particularly preferred embodiments of the process of preparing the coated materials and compositions utilizing them.

EXAMPLES

The following are representative examples of the process for preparing noble metal plated non-noble metal substrate powders and electrically conductive compositions incorporating such powders, according to the invention. These examples are not intended to be limiting of the range of such materials which can be prepared according to the invention. Other examples within the scope of the claims will be readily apparent to those skilled in the art.

Example 1—Plating Silver Onto Copper Powder

The process for plating silver onto copper powder according to the present invention comprises the following steps:

a) Preparation of Starter Plating Solution

A starter plating solution containing free silver ions was prepared by first dissolving 2600 g. of potassium cyanide in 15 l. of boiling water, contained in a first enamel-lined kettle. To this was added 1300 g. of silver oxide (1210.3 equivalent g. silver) with constant stirring until dissolved.

b) Preparation of Plating Solution Baths

Five plating solution baths were prepared from the starter plating solution. Into a second enamel-lined kettle was poured 0.8 (12 l.) of the volume of solution in the first kettle. got water (3 l.) was added to raise the volume to 15 l. This became the first plating solution bath, having a free silver concentration of 64.55 g./l. and supplying an equivalent weight of 968.2 g. of silver as free silver ions available for plating.

The remaining 0.2 (3 l.) of the volume of starter plating solution in the first kettle was raised to 15 l. by the addition of 12 l. of hot water. Into a third enamel-lined kettle was then poured 0.2 (3 l.) of the volume of solution in the first kettle. The remaining 0.8 (12 l.) of the volume of solution in the first kettle became the second plating solution bath, having a free silver concentration of 16.4 g./l. and supplying an equivalent weight of 193.7 g. of silver as free silver ions available for plating. got water (12 l.) was added to the volume (3 l.) of solution in the third kettle to raise the volume to 15 l. Into each of a fourth and fifth enamel-lined kettle was poured 0.1 (1.5 l.) of the volume of solution in the third kettle. The remaining 0.8 (12 l.) of the volume of solution in the third kettle became the third plating solution bath, having a free silver concentration of 3.23 g./l. and supplying an equivalent weight of 38.7 g. of silver as free silver ions available for plating.

Hot water (13.5 l.) was added to the 1.5 l. of solution in each of the fourth and fifth kettles. These solutions became, respectively, the fourth and fifth plating solution baths, each having a free silver concentration of 0.32 g./l. and each supplying an equivalent weight of 4.85 g. of silver as free silver ions available for plating.

c) Plating of Copper Powder with Silver

The first of five plating steps was performed by stirring 5670.0 g. of copper powder, having spherical shaped particles averaging 10 microns in diameter, into the first plating solution bath, maintained at a temperature around 68° to 70° C., to effect plating of the free silver ions in the bath onto the surface of the copper powder. When the first plating solution bath was substantially depleted of silver ions, the lean liquor was decanted from the powder and the intermediately plated copper powder (14.6 weight % silver) was first rinsed once with warm water, followed by a rinse with hot water.

The second plating step was performed by immersing the intermediately plated copper powder into the second plating solution bath, maintained at a temperature of from 85° to 95° C., to further plate the powder with the free silver ions contained therein. When the second plating solution bath was substantially depleted of silver ions, the lean liquor was decanted from the powder and the further intermediately plated copper powder (17.0 weight % silver) was rinsed with warm and hot water, as after completion of the first plating step.

The same procedure, including the post-plating rinse sequence of steps of rinsing in succession with warm and hot water, as performed above for the first and second plating steps with the first and second plating solution baths, was then repeated for the third plating step using the third plating solution bath.

After the rinsing sequence following the third plating step, the intermediately plated copper powder (17.5 weight % silver) was rinsed once with a second series of rinses which included the sequence of steps of rinsing the powder once with hot water, rinsing once with a 25% glacial acetic acid aqueous solution, rinsing a second time with hot water, and finally rinsing once with methanol.

After completion of the second series of rinses, the fourth plating step was performed by immersing the intermediately plated copper powder in the fourth plating solution bath, maintained at a temperature of from 85° to 95° C., to further plate the copper powder with the silver ions contained in the fourth plating solution bath. When the fourth plating solution bath was substantially depleted of silver ions, the lean liquor was decanted, and the still further intermediately plated copper powder (17.53 weight % silver) was rinsed first with warm water, followed by a rinse with hot water, as after previous plating steps.

The final, fifth plating step, including a post-plating sequence of steps of rinsing in succession with warm and hot water, was then performed following the same procedure as with previous plating steps, utilizing the fifth plating solution bath, to produce the final plated powder, having a silver content of 17.6 weight % of the total weight.

d) Post-Plating Rinsing of Final Plated Powder

After completion of the post-plating warm and hot water rinses following the fifth plating step, a second series of rinse steps, including the sequence of rinsing the final plated powder a first time with hot water; rinsing once with a 25% glacial acetic acid aqueous solution; rinsing a second time with hot water; and rinsing once with methanol, was performed four times in succession.

After completion of the fourth repetition of the second rinse series following the fifth plating step, the final plated powder was further rinsed with a third series of rinse steps, which included rinsing the powder 3 times in succession with hot water, followed by rinsing 3 times in succession with methanol.

The plated, rinsed powder was then allowed to air dry to produce the final plated product.

Example 2—Plating Silver Onto Nickel Powder

The process for plating silver onto nickel powder according to the present invention comprises the following steps:

a) Preparation of Starter Plating Solution

A starter plating solution containing free silver ions was prepared by first dissolving 2240 g. of potassium cyanide in 15 l. of boiling water, contained in a first enamel-lined kettle. To this was added 1164 g. of silver oxide (1083.6 equivalent g. silver) with constant stirring until dissolved.

b) Preparation of Plating Solution Baths

Four plating solution baths were prepared from the starter plating solution. Into each of second, third and fourth enamel-lined kettles was poured 0.25 (3.75 l.) of the starter plating solution, leaving 0.25 of the solution in the first kettle. Hot water (11.25 l.) was added to each of the four kettles to raise the volume in each to 15 l. Each of the four plating solution baths had a free silver concentration of 18.06 g./l. and supplied an equivalent weight of 270.9 g. silver as free silver ions available for plating.

c) Cleaning and Activation of Nickel Powder

Nickel powder (5670.0 g.) having spherical shaped particles averaging 10 microns in diameter was cleaned and activated to remove any grease, dirt and oxide coating on its outer surface which would interfere with plating, before commencement of the first plating step, by first mixing the nickel powder with liquid detergent to form a paste and then washing the powder paste with an activation solution made by dissolving 400 g. of potassium cyanide in 7.5 l. of boiling water (53.3 g./l.). Appearance of a dark foam indicated removal of the oxide coating on the outer surface of the powder. When foaming ceased, the activation solution was decanted and the cleaned, deoxidized nickel powder was rinsed twice with hot water. After rinsing, a small amount (75–100 ml.) of liquid detergent was mixed with the powder.

d) Plating of Nickel Powder with Silver

The first of four plating steps was performed by stirring the cleaned and activated nickel powder into the first plating solution bath, maintained at a temperature of from 50° to 80° C., preferably close to 74° C., to effect plating of the free silver ions in the bath onto the surface of the powder. When the first plating solution bath was substantially depleted of silver ions, the lean liquor was decanted from the powder and the intermediately plated nickel powder (4.6 weight % silver) was rinsed twice in succession with hot water.

The second through fourth plating steps were then performed following the same procedure of the first plating step, including the sequence of rinsing twice with hot water after each plating step. The only difference with the second through fourth plating steps was that the plating solution bath temperature for these plating steps was higher. The temperature of the subsequent plating solution baths was maintained at a temperature of from 85°–95° C., in comparison to the 50°–80° C. temperature of the first bath. After the second, third and fourth plating steps, the nickel powder was coated with 8.7, 12.5 and 15.8 weight % silver, respectively.

e) Post-Plating Rinsing of Final Plated Powder

After completion of the post-plating two hot water rinses, a second series of rinse steps, including the sequence of rinsing the final plated powder a first time with hot water; rinsing once with a 25% glacial acetic acid aqueous solution; rinsing a second time with hot water; and rinsing once with methanol, was performed a total of four times in succession.

After completion of the fourth repetition of the second rinse series following the fourth plating step, the final plated powder was further rinsed with a third series of rinse steps, which included rinsing the powder with three consecutive hot water rinses, followed by three consecutive rinses with methanol.

The second and third series of rinse steps, therefore, was identical to the second and third series performed for the preparation of silver coated copper powder, as in step (d) of Example 1, above.

The plated, rinsed powder was then allowed to air dry to produce the final plated product.

Example 3—Plating Silver Onto Copper-Seeded Aluminum Powder

The process for plating silver onto copper-seeded aluminum powder according to the present invention comprises the following steps:

a) Preparation of Starter Plating Solution

A starter plating solution containing free silver ions was prepared by first dissolving 990 g. of potassium cyanide in 15 l. of boiling water, contained in a first enamel-lined kettle. To this was added 495 g. of silver oxide (460.8 equivalent g. silver) with constant stirring until dissolved.

b) Preparation of Plating Solution Baths

Two plating solution baths of identical concentration were prepared from the starter plating solution. Into a second enamel-lined kettle was poured 0.5 (7.5 l.) of the starter plating solution, leaving the remaining half in the first kettle. Hot water (7.5 l.) was added to each of the kettles to raise the volume in each to 15 l. Each of the two plating solution baths had a free silver concentration of 15.36 g./l. and supplied an equivalent weight of 230.4 g. silver as free silver ions available for plating.

c) Preparation of Copper Seeding Solution

A solution for seeding copper atoms into the aluminum powder to be coated was prepared by dissolving 220.0 g. of copper sulfate (87.6 equivalent g. copper) in one gallon of cold water. The resulting solution was clear blue in color. To this solution was then added approximately 300 ml. ammonium hydroxide until the color of the solution became dark blue. Finally, approximately 178 g./l. of potassium cyanide solution was added to the copper solution. The resulting final copper seeding solution was transparent yellow in color.

d) Cleaning and Activation of Aluminum Powder

Aluminum powder (1816.0 g.) having spherical shaped particles averaging 10 microns in diameter was cleaned and activated to remove any grease, dirt and oxide coating on its outer surface which would interfere with plating, before commencement of the first plating step, by placing the aluminum powder in a container holding 10 liters of water. Sodium hydroxide (10.0 g.) was added with constant stirring. A froth evolving reaction occurred indicating cleaning and deoxidation of the aluminum powder was occurring. Stirring was maintained until cessation of the frothing reaction, which indicated that the aluminum powder was completely clean and activated. The sodium hydroxide solution was decanted and the activated aluminum powder was rinsed with cold water.

e) Seeding of Aluminum Powder with Copper

The cleaned and activated aluminum powder was the seeded with copper atoms by adding the copper seeding solution prepared in step (c), above, to the cleaned and activated aluminum powder prepared in step (d), above, with stirring. Copper atoms precipitated from the seeding solution to seed the aluminum powder. The resulting copper seeded aluminum powder became reddish in color. The lean copper seeding solution was then decanted and the copper-seeded aluminum powder was rinsed with cold water.

f) Plating of Copper-Seeded Aluminum Powder with Silver

In order to further facilitate the plating of silver onto the copper-seeded aluminum powder and to promote the production of high quality coated product having a high luster, liquid detergent was added to the powder before commencing the first plating step.

The first plating step was then performed by adding 1903.6 g. of copper-seeded aluminum powder, to which the liquid detergent had just been added, into the first plating solution bath, maintained at a temperature of around 32° C., to effect plating of the free silver ions in the bath onto the surface of the powder. When the first plating solution bath was substantially depleted of silver ions, the lean liquor was decanted from the powder and the intermediately plated powder (10.8 weight % silver) was rinsed twice in succession with cold water.

The second plating step was then performed by immersing the intermediately plated powder into the second plating solution bath, maintained at a temperature of from 60°–70° C., preferably 65° C., to further plate the copper-seeded aluminum powder with the free silver ions contained therein. When the second plating solution bath was substantially depleted of silver ions, the lean liquor was decanted from the powder and the final coated copper-seeded aluminum powder, having a silver content of 19.5 weight % of the total weight, was rinsed twice in succession with cold water as after the first plating step.

g) Post-Plating Rinsing of Final Plated Powder

After completion of the second cold water rinsing step following the final plating step, second and third series of rinse steps, identical to those performed in Examples 1 and 2, above, were performed.

The plated, rinsed copper-seeded aluminum powder was then allowed to air dry to produce the final plated product.

Example 4—Plating Gold Onto Nickel Powder

A coating of gold is plated onto a nickel powder substrate substantially in accordance with the four-step plating process of Example 2 with the following modifications. The steps of the process include:

a) Preparation of Starter Plating Solution

A starter plating solution containing free gold ions is prepared by first dissolving 1110 g. of ammonium chloride, 740 g. of sodium citrate and 150 g. of sodium hypophosphate in 15 l. of boiling water, contained in a first enamel-lined kettle. To this was added 64 g. of potassium gold cyanide (43.8 equivalent g. gold) with constant stirring until dissolved.

b) Preparation of Plating Solution Baths

Four plating solution baths are prepared from the starter plating solution. Into each of second, third and fourth enamel-lined kettles is poured 0.25 (3.75 l.) of the starter plating solution, leaving 0.25 of the solution in the first kettle. Hot water (11.25 l.) is added to each of the four kettles to raise the volume in each to 15 l. Each of the four plating solution baths has a free gold concentration of 0.73 g./l. and supplies an equivalent weight of 10.95 g. gold as free gold ions available for plating.

c) Cleaning and Activation of Nickel Powder

Nickel powder (230.0 g.) having spherical shaped particles averaging 8–10 microns in diameter is cleaned and activated to remove any grease, dirt and oxide coating on its outer surface which would interfere with plating, before commencement of the first plating step, by following the procedure described above in step (c) of Example 2.

d) Plating of Nickel Powder with Gold

The first of four plating steps is performed by stirring the cleaned and activated nickel powder into the first plating solution bath, maintained at a temperature of from 50° to 80° C., preferably close to 74° C., to effect plating of the free silver ions in the bath onto the surface of the powder. When the first plating solution bath is substantially depleted of gold ions, indicated by the solution turning greenish in color and the nickel powder turning gold in color, the lean liquor is decanted from the powder and the intermediately plated nickel powder (4.5 weight % gold) is rinsed twice in succession with hot water.

The second through fourth plating steps are then performed following the same procedure of the first plating step, including the sequence of rinsing twice with hot water after each plating step. The only difference with the second through fourth plating steps is that the plating solution bath temperature for these plating steps is higher. The temperature of the subsequent plating solution baths is maintained at a temperature of from 90°–98° C., in comparison to the 50°–80° C. temperature of the first bath. Care must be taken that the solution does not reach the boiling point, however, because the volume of a boiling solution increases 250 percent upon introduction of the nickel powder, due to excessive frothing. After the second, third and fourth plating steps, the nickel powder was coated with 8.7, 12.5 and 16.0 weight % gold, respectively.

e) Post-Plating Rinsing of Final Plated Powder

After completion of the post-plating two hot water rinses, the second and third series of rinse steps are performed identically as described above in step (e) of Example 2 for the rinsing of silver-coated nickel powder.

Finally, the plated, rinsed powder is allowed to air dry to produce the final plated product.

Example 5—Preparation of an Electromagnetic
Interference Shielding Material Containing
Silver-Coated Copper Particles A silicone rubber-based electromagnetic interference shielding material containing silver-coated copper powder particles is prepared by mixing 34.0 g. of a silicone rubber gum, such as #440 silicone rubber gum manufactured by Dow Corning Corp., Midland, Michigan, with 0.3 g. of (2,5-dimethyl, 2,5-di-t-butyl-peroxy) hexane, such as is sold under the tradename Varox, manufactured by R. T. Vanderbilt Co., and 3.7 g. of silica, such as CAB-O-SIL MS7 silica, with 238.0 g. of approximately 17 weight percent silver plated onto copper powder particles prepared according to the process of Example 1, above. The mixture is blended to homogeneity in a mill mixer. The mixture is then molded into parts or rolled into sheet at a temperature of around 325° F., and under a pressure of approximately 30 tons, for from 14–20 minutes. The molded parts are then post cured at a temperature of around 350° F. for 3 hours. The final shielding material has a composition of 86.2 weight percent silver coated copper powder particles.

Example 6—Preparation of an Electromagnetic
Interference Shielding Material Containing
Silver-Coated Copper Particles An electromagnetic interference shielding material containing silver-coated copper powder particles is prepared by mixing 11 parts by weight of epoxy with 89 parts by weight of silver-coated copper powder particles prepared according to the process of Example 1, above, but wherein the coated copper particles contain from 5–8 weight percent silver, and wherein the silver coated copper particles added to the epoxy are sized such that 85% pass through a 200 mesh screen.

Example 7—Preparation of an Electromagnetic
Interference Shielding Material Containing
Silver-Coated Nickel Particles A silicone rubber-based electromagnetic interference shielding material containing silver-coated nickel powder particles is prepared by mixing 0.0978 parts by weight of a silicone rubber gum, such as #440 silicone rubber gum manufactured by Dow Corning Corp., Midland, Mich., with 0.0008635 parts by weight of (2,5-dimethyl, 2,5-di-t-butyl-peroxy) hexane, such as is sold under the tradename Varox, manufactured by R. T. Vanderbilt Co., and 0.0106505 parts by weight of silica, such as CAB-O-SIL MS7 silica, with 0.6846 parts by weight of approximately 15 weight percent silver plated onto nickel powder particles prepared according to the process of Example 2, above. The mixture is blended to homogeneity in a mill mixer. The mixture is then molded into parts or rolled into sheet at a temperature of around 325° F., and under a pressure of approximately 30 tons, for from 14–20 minutes. The molded parts are then post cured at a temperature of around 350° F. for 3 hours. The final shielding material has a composition of 86.2 weight percent silver coated nickel powder particles.

Example 8—Preparation of an Electromagnetic
Interference Shielding Material Containing
Silver-Coated Aluminum Particles A silicone rubber-based electromagnetic interference shielding material containing silver plated aluminum powder particles is prepared by mixing 34.0 g. of a silicone rubber gum, such as #440 silicone rubber gum manufactured by Dow Corning Corp., Midland, Mich., with 0.3 g. of (2,5-dimethyl, 2,5-di-t-butyl-peroxy) hexane, such as is sold under the tradename Varox, manufactured by R. T. Vanderbilt Co., and 3.7 g. of silica, such as CAB-O-SIL MS7 silica, with 63.0 g. of approximately 20 weight percent silver plated onto copper-seeded aluminum powder particles prepared according to the process of Example 3, above. The mixture is blended to homogeneity in a mill mixer. The mixture is then molded into parts or rolled into sheet at a temperature of around 325° F., and under a pressure of approximately 30 tons, for from 14–20 minutes. The molded parts are then post cured at a temperature of around 350° F. for 3 hours. The final shielding material has a composition of 62.4 weight percent silver coated aluminum powder particles.

Example 9—Preparation of an Electrically
Conductive Resin-Based Material Containing
Silver-Coated Nickel Particles An electrically conductive resin-based material containing gold-coated nickel powder particles is prepared by mixing from four to six parts by weight of a silver-coated nickel powder prepared according to Example 2, above, with one part by weight of an epoxy resin, such as is commercially available under the tradename TITAN-TITE, a clear epoxy resin, manufactured by Glass Plastic Corp., Linden, N.J.

Example 10—Preparation of an Electrically Conductive Resin-Based Material Containing Gold-Coated Nickel Particles An electrically conductive resin-based material containing gold-coated nickel powder particles is prepared by mixing from five to six parts by weight of a gold-coated nickel powder prepared according to Example 4, above, with one part by weight of the TITAN-TITE clear epoxy resin described in Example 8, above.

Example 11—Preparation of Electrically Conductive Copolymer Materials Containing Silver Plated Nickel Particles Various electrically conductive copolymer materials containing silver plated nickel powder particles are prepared by first preparing a copolymer matrix composition according to the following formulations:

| a) Copolymer composition | Parts by weight |
|---|---|
| ARCHLOR 5442 | 3–8 |
| ARCHLOR 1254 | 1–5 |
| EASTOBOND M-5H | 1–6 |

ARCHLOR 5442 is the tradename of a chlorinated triphenyl plastic manufactured by Monsanto Co., St. Louis, Mo. ARCHLOR 1254 is the tradename of a chlorinated biphenyl plastic manufactured by Monsanto Co., St. Louis, Mo. EASTOBOND M-5H is the tradename of an amorphous polypropylene plastic manufactured by Eastman Chemical Products, Inc., Kingsport, Tenn.

| b) Copolymer composition | Parts by weight |
|---|---|
| ARCHLOR 5442 | 2–7 |
| ARCHLOR 1254 | 2–6 |
| EASTOBOND M-5H | 1.5–5 |
| ELVAX 150 | 1.5–6 |

ELVAX 150 is the tradename of a copolymer composed of 67 weight percent ethylene and 33 weight percent vinyl acetate, manufactured by E.I. Du Pont de Nemours, Wilmington, Del.

| c) Copolymer composition | Parts by weight |
|---|---|
| ARCHLOR 5442 | 1.5–7 |
| ARCHLOR 1254 | 2–6 |
| EASTOBOND M-5H | 1–5 |
| SUPER BECKACITE 2100 | 1.5–4.5 |

SUPER BECKACITE 2100 is the tradename of a phenolic resin copolymer composed of phenol, formaldehyde, and terpine, manufactured by Reichhold Chemicals, Inc., White Plains, N.Y.

| d) Copolymer composition | Parts by weight |
|---|---|
| ARCHLOR 5442 | 5–7 |
| ARCHLOR 1254 | 2–6 |
| EASTOBOND M-5H | 1–5 |
| SUPER BECKACITE 2000 | 1.5–5 |

SUPER BECKACITE 2000 is the tradename of a phenolic resin copolymer composed of a terpine phenol polymer, made Reichhold Chemicals, Inc., White Plains, N.Y.

| e) Copolymer composition | Parts by weight |
|---|---|
| ARCHLOR 5442 | 1.5–7 |
| ARCHLOR 1254 | 2–6 |
| EASTOBOND M-5H | 1–5 |
| SUPER BECKACITE 1050 | 1.5–5 |

SUPER BECKACITE 1050 is the tradename of a phenolic resin copolymer composed of a phenol formaldehyde copolymer, manufactured by Reichhold Chemicals, Inc., White Plains, N.Y.

For all of the above copolymer matrix formulations, the listed ingredients are placed in a pyrex glass container and heated with constant stirring until the mixture becomes a clear homogeneous liquid. The electrically conductive materials are prepared by combining from 3 to 7 parts by weight of silver coated nickel powder particles prepared according to the process of Example 2, above, with 1 part by weight of any of the above liquified copolymer compositions (a) through (e).

Example 12—Preparation of Electrically Conductive Copolymer Materials Containing Gold Plated Nickel Particles Various electrically conductive copolymer materials containing gold plated nickel powder particles are prepared by first preparing a copolymer matrix composition according to any of the formulations designated (a) through (e) in Example 11, above. The electrically conductive materials are prepared by then combining from 3 to 7 parts by weight of a gold coated nickel powder particles prepared according to the process of Example 4, above, with 1 part by weight of any of the above liquified copolymer compositions (a) through (e).

Example 13—Preparation of an Electrically Conductive Thermoset Plastic Material Containing Silver-Coated Nickel Particles An electrically conductive thermosetting polyurea based plastic material containing silver-coated nickel powder particles is prepared as a two part formulation which is combined at time of use as follows:

The first part of the formulation is prepared by mixing 0.84 parts by weight of a modified polyamine such as is commercially available under the tradename AMINE-100, manufactured by General Mills Chemicals, Kankakee, Ill., with 0.43 parts by weight of xylene solvent. To this is added 3.8 parts by weight of silver-coated nickel powder prepared according to the process of Example 2, above, to form the first part of the thermosetting plastic material.

The second part of the formulation is prepared by mixing 1.26 parts by weight of diisocyanate, such as is commercially available under the tradename D.D.I. 1410 manufactured by General Mills Chemicals, Kankakee, Ill., with 0.60 parts by weight of toluene solvent. To this is added 6.3 parts by weight of silver-coated nickel powder prepared according to the process of Example 2, above, to form the second part of the thermosetting plastic material.

The first and second parts of the electrically conductive thermosetting plastic material are kept separate until such time as it is desired to from the thermosetting plastic material, when the first and second parts are mixed in a 1:1 weight ratio to form the electrically conductive thermosetting plastic material.

Example 14—Preparation of an Electrically Conductive Thermoset Plastic Material Containing Gold-Coated Nickel Particles An electrically conductive thermosetting polyurea based plastic material containing gold-coated nickel powder particles is prepared in the same manner as is described in Example 13, above, except that gold-coated nickel powder particles prepared according to the process of Example 4, above, are substituted for the silver-coated nickel powder particles.

Example 15—Preparation of an Electrically Conductive Polyamide and Epoxy Based Plastic Material Containing Silver-Coated Nickel Particles An electrically conductive polyamide and epoxy based plastic material containing silver-coated nickel powder particles is prepared by mixing 0.5 parts by weight of a polyamide resin which is the reaction product of linoleic acid and polyamine, such as is commercially available under the tradename VERSAMID 115, manufactured by General Mills Chemicals, Kankakee, Ill., with 0.5 parts by weight of an epoxy which is diglycidyl ether of bisphenol A, such as is commercially available under the tradename GENEPOXY 190, manufactured by General Mills Chemicals, Kankakee, Ill., and 6 parts by weight of silver-coated nickel powder particles prepared according to the process of Example 2, above.

Example 16—Preparation of an Electrically Conductive Polyamide and Epoxy Based Plastic Material Containing Gold-Coated Nickel Particles An electrically conductive polyamide and epoxy based plastic material containing gold-coated nickel powder particles is prepared in the same manner as is described in Example 15, above, except that gold-coated nickel powder particles prepared according to the process of Example 4, above, are substituted for the silver-coated nickel powder particles.

Example 17—Preparation of an Electrically Conductive Adhesive Material Containing Silver-Coated Nickel Particles An electrically conductive adhesive material containing silver-coated nickel powder particles is prepared by first preparing a mixture containing from 2 to 6 parts by weight of ARCHLOR 5442; from 3 to 7 parts by weight of ARCHLOR 1254; and from 1 to 6 parts by weight of EASTOBOND M-5H. The above components are heated in a pyrex glass dish with constant stirring until they liquify into a homogeneous clear liquid. From 3.5 to 6.5 parts by weight of silver-coated nickel powder particles prepared according to the process of Example 2, above, are added to 1 part by weight of the above copolymer liquid, with constant stirring. The resulting mixture is cooled allowing the copolymer liquid to solidify into an adhesive consistency with the silver-coated nickel powder particles distributed throughout the adhesive composition. The final composition has good to excellent electrical conductivity.

Example 18—Preparation of an Electrically Conductive Adhesive Material Containing Gold-Coated Nickel Particles An electrically conductive adhesive material containing gold-coated nickel powder particles is prepared by first preparing the liquid copolymer mixture described above in Example 11. From 4.5 to 7.0 parts by weight of gold-coated nickel powder particles prepared according to the process of Example 4, above, are added to 1 part by weight of the above copolymer liquid, with constant stirring. The resulting mixture is cooled allowing the copolymer liquid to solidify into an adhesive consistency with the gold-coated nickel powder particles distributed throughout the adhesive composition. The final composition has good to excellent electrical conductivity.

Example 19—Preparation of an Electrically Conductive Adhesive Material Containing Silver-Coated Nickel Particles An electrically conductive adhesive material containing silver-coated nickel powder particles is prepared by first preparing a mixture containing 76 parts by weight of isooctyl acrylate, 20 parts by weight of N-vinyl-2-pyrrolidone, 4 parts of acrylamide, and 0.04 parts by weight of a photoinitiator, such as 2,2-dimethoxy-2-phenylacetophenone, as is available under the tradename Irgacure 651, and then partially photopolymerizing the mixture to a syrup having a viscosity of about 2000 centipoise. To 85 parts by weight of this syrup is added 15 parts by weight of silver plated nickel particles prepared substantially in accordance with the process of Example 2, above, but using flake-shaped nickel particles, rather than the spherical shaped particles of that example. To the particle-filled syrup is added 0.05 parts by weight of a crosslinking agent, such as hexanediol diacrylate and an additional 0.1 part by weight of photoinitiator. This mixture is then immediately coated between two silicone-treated transparent plastic films to a thickness of about 50 microns. The coating is then magnetized and photopolymerized into a pressure-sensitive adhesive state. The resulting sheet can be cut into strips.

Example 20—Preparation of an Electrically Conductive Adhesive Material Containing Silver-Coated Aluminum Particles An electrically conductive adhesive material containing silver-coated aluminum particles is prepared by mixing from 73–80 parts by weight of a silver-coated copper-seeded aluminum powder prepared according to the process of Example 3, above, with about 20 parts by weight of a solid polyamide resin, such as is commercially available under the name of VERSALON 1100, 5 parts by weight of a liquid polyamide resin, such as is commercially available under the name VERSAMID 125, 24 parts by weight of toluene, and 26 parts by weight of ethanol.

Example 21—Preparation of an Electrically Conductive Adhesive Paint Containing Silver-Coated Nickel Particles An electrically conductive adhesive paint containing silver-coated nickel powder particles is prepared by combining 3 parts by weight of the copolymer base mixture prepared according to Example 17, above, with 4 parts by weight of trichloroethylene. The ingredients are heated and stirred until a clear solution forms. To this clear liquid solution is then added 12 parts by weight of silver-coated nickel powder particles prepared according to the process of Example 2, above. The highly volatile trichloroethylene is then allowed to evaporate, leaving a thin film of electrically conductive pressure-sensitive material.

Example 22—Preparation of an Electrically Conductive Adhesive Paint Containing Gold-Coated Nickel Particles An electrically conductive adhesive paint containing gold-coated nickel powder particles is prepared in the same manner as is described in Example 21, above, except that gold-coated nickel powder particles, prepared according to the process of Example 4, above, are substituted for the silver-coated nickel powder particles.

Example 23—Preparation of an Electrically Conductive Ink Containing Silver-Coated Nickel Particles A polyester-based electrically conductive ink containing silver-coated nickel particles is prepared by mixing 16.78 parts by weight of silver-coated nickel powder particles prepared according to the process of Example 2, above, with 100 parts by weight of a polyester resin solution containing about 35 weight percent solids, and about 0.5 parts by weight of a flow modifier, such as MODAFLOW, as is available from Monsanto Corp., St. Louis, Mo.

The foregoing examples are representative of the range of coated products which can be prepared according to the process of this invention and are not intended to be in any way limiting. Application of the process of this invention to the preparation of other coated products within the scope of the claims which here follow will be readily apparent to those skilled in the art.

What is claimed is:

1. A process for plating a coating of a noble metal onto a non-noble metal substrate material, said process comprising the steps of:

a) preparing a starter aqueous plating solution containing an amount of free ions of a noble metal to be plated out onto said substrate material, said noble metal being selected from the group consisting of silver, gold, platinum, palladium, iridium, rhodium, ruthenium and osmium, such that said amount of free ions of said noble metal is sufficient to plate an amount of an active, non-noble metal substrate material, in the form of a powder, with a coating of from 2 to 60 weight percent, based on the total weight of a final noble metal-coated active non-noble metal substrate material product, and such that said amount of free ions of said noble metal plated onto said active non-noble metal substrate material is sufficient to at least provide a coating on the surface of said active non-noble metal substrate material that completely covers the entire surface of said active non-noble metal substrate material, leaving no exposed surface of said active non-noble metal substrate material, said non-noble metal substrate material being selected from the group consisting of copper, nickel, aluminum, titanium, zirconium, vanadium, hafnium, cadmium, niobium, tantalum, molybdenum, tungsten, gallium, indium, thallium, and combinations of a first one of said non-noble metal substrate materials seeded with atoms of a second one of said non-noble metal substrate materials having a greater affinity than that of said first non-noble metal substrate material for said selected noble metal to be plated thereon;

b) dividing said starter plating solution, prepared in step (a), into a plurality of portions, such that each portion of said starter plating solution contains a percentage amount of from less than about 1% to about 85% by weight, of the total amount of free ions of noble metal to be plated out that are contained in said starter plating solution, the percentage amount that is present in any said portion being the same as or different from the percentage amount present in other of said portions;

c) preparing a plurality of individual plating solution baths into which said active non-noble metal substrate material is immersible, by selecting a concentration of free ions of noble metal for each said plating solution bath which is to be made from a corresponding one of said plurality of portions of said starter plating solution, prepared in step (b), said concentration of free ions of noble metal for each said individual plating solution bath being in the range of from about 0.3 to about 65 grams of free ions of noble metal per liter of plating solution bath, and making each said individual plating solution bath by adding water to each corresponding one of said plurality of portions of said starter plating solution, to increase the volume thereof, such that each one of said plurality of individual plating solution baths has the concentration of free ions of noble metal, as selected above therefor;

d) immersing an amount of an active non-noble metal substrate material to be plated into one of said individual plating solution baths, prepared in step (c), which is maintained at a temperature in the range of from about 20° C. to about 100° C., such that the temperature of said individual plating solution bath is inversely related to the oxidation potential of the non-noble metal substrate material being plated, to cause said free ions of noble metal to plate-out onto said substrate material until said one of said individual plating solution baths is depleted of all but a trace amount of said free noble metal ions contained therein, thereby forming an intermediate plated substrate material on which is plated the fraction of free ions of noble metal contained in said one of said individual plating solution baths;

e) separating said intermediate plated substrate material, prepared in step (d), from the depleted plating solution bath;

f) rinsing said intermediate plated substrate material, separated in step (e), at least once with a first series of water rinses;

g) repeating steps (d), (e), and (f) with the rinsed intermediate plated substrate material resulting from each previous sequence of steps (d), (e), and (f), and another one of said individual plating solution baths, until all of said individual plating solution baths prepared according to step (c) have been utilized, the sequence of utilization of said individual plating solution baths being such that when the concentration of free noble-metal ions in at least two of said individual plating solution baths is different, said individual plating solution baths are successively utilized in the order of decreasing concentration of free ions of noble metal therein, and further such that the temperature of each successively utilized individual plating solution bath is at least as high as the temperature of the preceding individual plating solution bath, thereby forming further intermediate plated substrate materials with each repetition of the sequence of steps (d), (e) and (f), such that each successive intermediate plated substrate material is cumulatively plated with the amounts of free ions of noble metal contained in each of the plating solution baths into which the intermediate plated substrate material has been immersed, thereby ultimately forming a final plated substrate material, onto which has been plated the total said amount of free ions of noble metal in said original starter plating solution;

h) rinsing said final plated substrate material, prepared in step (g), at least once with a second series of rinses, including rinses with water, an acid, and an alcohol;

i) further rinsing said final plated substrate material, as rinsed according to step (h), at least once with a third series of rinses, including rinses with water, and an alcohol; and j) drying said final plated substrate material, as rinsed accordinq to step (i), to produce a final noble metal-coated active non-noble metal substrate material product.

2. The process of claim 1 wherein said noble metal is selected from the group consisting of silver, gold, and platinum, and said non-noble metal substrate material is selected from the group consisting of copper, nickel, copper-seeded aluminum, titanium, and zirconium.

3. The process of claim 1 wherein the starter aqueous plating solution is prepared by dissolving an amount of a compound selected from the group consisting of a cyanide, chloride, nitrate, and an oxide of the noble metal, in boiling water, to which has first been added an amount of an alkali metal cyanide of from about 0 to 2.5 times the weight of the selected noble metal compound, the amount utilized being determined by the degree of solubility of the noble metal-containing compound in water, such that the amount of alkali metal cyanide utilized is sufficient to effect dissolution of the selected noble metal compound in the solution to produce the desired amount of free ions of the noble metal.

4. The process of claim 3 wherein when the noble metal is gold, supplied in any of the selectable forms of noble metal compound, the amount of alkali metal cyanide utilized is zero, and further wherein is added to the boiling water prior to addition of the gold-containing compound, a mixture of ammonium chloride, sodium citrate and sodium hypophosphate in a weight ratio of from about 7.0–8.0:4.5–5.5:1, with the overall amount of mixture added to the water being such that the weight of sodium hypophosphate in the mixture is from about 2.0 to 2.5 times the weight of the gold-containing compound.

5. The process of claim 3 wherein the noble metal oxide is selected from the group consisting of silver oxide, gold oxide and platinum mon-, di-and tri-oxide.

6. The process of claim 3 wherein the noble metal cyanide is selected from the group consisting of silver cyanide, gold cyanide, platinum cyanide, potassium cyanoaurate, potassium cyanoargentate, potassium cyanoplatinite, sodium cyanoaurite and sodium cyanoplatinite.

7. The process of claim 3 wherein the noble metal chloride is selected from the group consisting of silver chloride, gold chloride, platinum chloride, potassium chloroaurate, potassium tetra-and hexa-chloroplatinate, sodium chloroaurate, sodium chloro-and hexachloro-platinate and sodium chloroplatinite.

8. The process of claim 3 wherein the noble metal nitrate is selected from the group consisting of silver nitrate, gold nitrate, potassium nitroplatinite and sodium nitroplatinite.

9. The process of claim 6 wherein the alkali metal cyanide is selected from the group consisting of sodium cyanide and potassium cyanide.

10. The process of claim 1 wherein said powder of active, non-noble metal substrate material has spherical, flake-shaped or irregular-shaped particles.

11. The process of claim 10 wherein said powder of active, non-noble metal substrate material has spherical particles.

12. The process of claim 10 wherein said spherical particles have a mean diameter of from 5 to 15 microns.

13. The process of claim 10 wherein the the largest dimension of the flake-shaped and irregular-shaped particles is 20 microns.

14. The process of claim 1 wherein the coating of noble metal plated onto the non-noble metal substrate material is from 15 to 25 weight percent, based on the total weight of final noble metal-coated active non-noble metal substrate material product.

15. The process of claim 1 wherein the starter plating solution is divided into from 2 to 5 portions.

16. The process of claim 1 wherein a first portion of the plurality of portions into which said starter plating solution is divided contains from about 20% to about 85%, by weight, of the total amount of free ions of noble metal to be plated out, contained in said starter plating solution; a second portion of the plurality of portions into which said starter plating solution is divided contains from about 15% to about 55%, by weight, of the total amount of free ions of noble metal to be plated out, contained in said starter plating solution; where a third portion is utilized, said third portion contains from about 1% to about 30%, by weight, of the total amount of free ions of noble metal to be plated out, contained in said starter plating solution; where a fourth portion is utilized, said fourth portion contains from about 0.1% to about 30%, by weight, of the total amount of free ions of noble metal to be plated out, contained in said starter plating solution; and where a fifth or subsequent portion is utilized, each of said fifth and subsequent portions contains less than about 1%, by weight, of the total amount of free ions of noble metal to be plated out, contained in said starter plating solution; such that the sum of the percentages in all of the portions is 100%.

17. The process of claim 1 wherein the separation of plated substrate material from a depleted plating solution bath is by decantation.

18. The process of claim 1 wherein the first series of rinses of plated substrate material comprises a sequence of steps selected from the group consisting of rinsing twice in succession with cold water; rinsing once with warm water, followed by rinsing once with hot water; and rinsing twice in succession with hot water.

19. The process of claim 1 wherein the second series of rinses of final plated substrate material comprises the sequence of steps of rinsing once with hot water; rinsing once with a weak acid; rinsing a second time with hot water; and rinsing once with an alcohol.

20. The process of claim 19 wherein the weak acid is an aqueous solution of an acid selected from the group consisting of glacial acetic acid, dilute hydrochloric acid, dilute nitric acid, and hydrazine.

21. The process of claim 20 wherein the weak acid is an aqueous solution of 25% glacial acetic acid.

22. The process of claim 19 wherein the alcohol is a lower alkanol having from 1 to 4 carbon atoms.

23. The process of claim 22 wherein the lower alkanol is methanol.

24. The process of claim 1 wherein the second series of rinse steps is performed in sequence from one to four times.

25. The process of claim 24 wherein the second series of rinse steps is performed four times.

26. The process of claim 1 wherein the third series of rinses of final plated substrate material comprises the sequence of steps of rinsing from 1 to 3 times in succession with hot water, followed by rinsing in succession from 1 to 3 times with an alcohol.

27. The process of claim 26 wherein the alcohol is a lower alkanol having from 1 to 4 carbon atoms.

28. The process of claim 27 wherein the lower alkanol is methanol.

29. The process of claim 26 wherein 3 hot water rinses in succession, followed by 3 alcohol rinses in succession are performed.

30. The process of claim 29 wherein the alcohol is methanol.

31. The process of claim 1 wherein drying of the final plated substrate material is by at least one of the methods selected from the group consisting of washing with acetone; washing with methanol; air drying at ambient temperature and pressure; air drying with hot air; and vacuum drying under reduced pressure.

32. The process of claim 1 wherein a non-noble metal substrate which is contaminated with one or more of an outer oxidized layer; a coating of dirt; and a coating of grease, all of which reduce the activity and susceptability of the non-noble metal to be plated with noble metal ions, is first cleaned and made active before commencement of plating by washing with a cleaning and activating solution.

33. The process of claim 32 wherein the cleaning and activating solution is selected from the group consisting of a sodium or potassium hydroxide solution and a sodium or potassium cyanide solution.

34. The process of claim 33 wherein if the cleaning and activating solution is potassium cyanide solution, the substrate is first mixed with a liquid detergent before washing with the solution.

35. The process of claim 1 further comprising mixing the active non-noble metal substrate material with a liquid detergent prior to immersing the substrate material in the first plating solution bath.

36. The process of claim 1 further comprising the step of repeating said first series of water rinse steps, according to step (f), once, after completion of the first series of rinse steps, which follows immersion of the plated substrate material in the individual plating solution bath in which the substrate material is plated with the percentage of free ions of noble metal cumulatively amounting to at least 85% of the total amount of free ions of noble metal to be plated out, with there then remaining at least one more plating solution bath in which plating of the remaining percentage of free ions of noble metal onto the substrate material is completed.

37. The process of claim 33 wherein the cleaning and activating solution is a sodium or potassium hydroxide solution which has a concentration of from 0.5 to 1.5 g/l.

38. The process of claim 33 wherein the cleaning and activating solution is a sodium or potassium cyanide solution which has a concentration of from 50 to 60 g/l.

39. The process of claim 1 wherein the non-noble metal substrate material to be plated is first seeded with atoms of another non-noble metal onto which the noble metal ions more readily plate.

40. The process of claim 39 wherein the seeding is performed by washing the substrate with a solution containing free ions of the seeding metal.

41. The process of claim 40 wherein the free ions of the seeding metal are supplied by dissolving a salt of the seeding metal in water and adding ammonium hydroxide and potassium cyanide thereto to maintain the ions of the seeding metal free in solution.

42. A process for plating silver onto copper according to claim 1 wherein said noble metal is silver; said non-noble metal substrate material is copper powder having spherical particles with a mean diameter of from 5 to 15 microns; the weight of coating is from 15 to 60 weight percent, based on the total weight of a final noble metal-coated non noble metal substrate material product; said starter plating solution is divided into 5 portions with 5 said individual plating solution baths being prepared therefrom, such that 75% to 85% of the total amount of free ions of noble metal to be plated out is contained in the first individual plating solution bath; 10% to 20% of the total amount of free ions of noble metal to be plated out is contained in the second individual plating solution bath; 1% to 5% of the total amount of free ions of noble metal to be plated out is contained in the third individual plating solution bath; and 0.1% to 0.5% of the total amount of free ions of noble metal to be plated out is contained in each of the fourth and fifth individual plating solution baths, such that the total of all percentages of amounts of free ions of noble metal to be plated out in the 5 baths is 100%; the first individual plating solution bath is maintained at a temperature of from 50° C. to 80° C.; the second through fifth individual plating solution baths are maintained at a temperature of from 85° C. to 100° C.; said first series of water rinse steps is performed once and comprises the sequence of steps of rinsing once with warm water, followed by rinsing once with hot water; said second series of rinse steps if repeated 4 times in succession after completion of the first series of water rinse steps following plating in the fifth individual plating solution bath, and comprises the sequence of steps of rinsing once with hot water; rinsing once with a 25% glacial acetic acid aqueous solution; rinsing a second time with hot water; and rinsing once with methanol; said third series of rinse steps is performed once and comprises the sequence of steps of rinsing 3 times with hot water, followed by rinsing 3 times with methanol; and said process further comprises performing a second series of rinse steps once, after completion of the first series of rinse steps which follows after plating in the third individual plating solution bath.

43. The process according to claim 42 wherein drying of the final plated substrate material is by air drying at ambient temperature and pressure.

44. The process according to claim 42 wherein the weight of coating is from 15.0 to 25.0 weight percent, based on the total weight of final noble metal coated active non-noble metal substrate material product.

45. The process according to claim 42 wherein the weight of coating is 17.6 weight percent, based on the total weight of final noble metal coated active non-noble metal substrate material product, and 80% of the total amount of free ions of noble metal to be plated out is contained in the first individual plating solution bath; 16% of the total amount of free ions of noble metal to be plated out is contained in the second individual plating solution bath; 3.2% of the total amount of free ions of noble metal to be plated out is contained in the third individual plating solution bath; and 0.4% of the total amount of free ions of noble metal to be plated out is contained in each of the fourth and fifth individual plating solution baths.

46. A process for plating silver onto nickel according to claim 1 wherein said noble metal is silver; said non-noble metal substrate material is nickel powder having spherical particles with a mean diameter of from 5 to 15 microns; the weight of coating is from 15 to 60 weight percent, based on the total weight of final noble metal coated active non-noble metal substrate material product; said starter plating solution is divided into 4 equal portions with 4 said individual plating solution baths being prepared therefrom, such that 25% of the total amount of free ions of noble metal to be plated out is contained in each individual plating solution bath; the first individual plating solution bath is maintained at a temperature of from 50° C. to 80° C.; the second through fourth individual plating solution baths are maintained at a temperature of from 85° to 100° C.; said first series of water rinse steps comprises the sequence of steps of rinsing twice with hot water; said second series of rinse steps is repeated 4 times in succession after completion of said first series of water rinse steps following plating in the fourth individual plating solution bathA and comprises the sequence of steps of rinsing once with hot water; rinsing once with a 25% glacial acetic acid aqueous solution; rinsing a second time with hot water; and rinsing once with methanol; said third series of rinse steps is performed once and comprises the sequence of steps of rinsing 3 times with hot water, followed by rinsing 3 times with methanol; and said process further comprises cleaning and activating said nickel powder substrate material prior to its immersion in the first individual plating solution bath.

47. The process of claim 46 wherein cleaning and activation of the nickel powder comprises the steps of first mixing the nickel powder with liquid detergent to form a paste; mixing the nickel powder paste with a potassium cyanide activation solution; separating the cleaned and activated nickel powder from the activation solution; washing the activated nickel powder twice with hot water; and remixing the cleaned and activated nickel powder with liquid detergent.

48. The process of claim 46 wherein drying of the final plated substrate material is by air drying at ambient temperature and pressure.

49. The process of claim 46 wherein the weight of coating is from 15.0 to 25.0 weight percent, based on the total weight of final noble metal-coated active non-noble metal substrate material product.

50. The process of claim 46 wherein the weight of coating is 16.0 weight percent, based on the total weight of final noble metal-coated active non-noble metal substrate material product; said first individual plating solution bath is maintained at a temperature of 75° C.; and said second through fourth individual plating solution baths are maintained at a temperature of 100° C.

51. A process for plating silver onto aluminum seeded with copper according to claim 1, wherein said noble metal is silver; said non-noble metal substrate material is aluminum powder having spherical particles with a mean diameter of from 5 to 15 microns, and which have been seeded with copper atoms; the weight of coating is from 15 to 60 weight percent, based on the total weight of final noble metal-coated non-noble metal active substrate material product; said starter plating solution is divided into 2 equal portions with 2 said individual plating solution baths being prepared therefrom, such that 50% of the total amount of free ions of noble metal to be plated out is contained in each individual plating solution bath; the first individual plating solution bath is maintained at a temperature of from 25° C. to 35° C.; the second individual plating solution bath is maintained at a temperature of from 60° C. to 70° C.; said first series of water rinse steps is performed once and comprises rinsing twice in succession with cold water; said second series of rinse steps is repeated 4 times in succession after completion of said first series of rinse steps following plating in the second individual plating solution bath, and comprises the sequence of steps of rinsing once with hot water; rinsing once with a 25% glacial acetic acid aqueous solution; rinsing a second time with hot water; and rinsing once with methanol; said third series of rinse steps is performed once and comprises the sequence of steps of rinsing 3 times with hot water, followed by rinsing 3 times with methanol; and said process further comprises the initial steps, all performed before the first plating step, of cleaning and activating the aluminum powder; seeding the aluminum powder with copper atoms; and mixing the copper-seeded aluminum powder with liquid detergent.

52. The process of claim 51 wherein cleaning and activation of the aluminum powder comprises the step of washing it with a sodium or potassium hydroxide solution.

53. The process of claim 52 wherein the sodium or potassium hydroxide solution has a concentration of from 0.5 to 1.5 g/l.

54. The process of claim 51 wherein the initial step of seeding aluminum powder with copper atoms is performed by immersing the aluminum powder in a solution containing free copper ions.

55. The process of claim 54 wherein the solution containing free copper ions is an aqueous copper sulfate solution.

56. The process of claim 55 wherein the copper sulfate solution has a concentration of from 200 to 250 g/gal.

57. The process of claim 56 wherein the solution further contains ammonium hydroxide and sodium or potassium cyanide.

58. The process of claim 57 wherein ammonium hydroxide is added to the aqueous copper sulfate solution in the amount of 300 ml/g.

59. The process of claim 57 wherein sodium or potassium cyanide is added as aqueous sodium or potassium cyanide solution having a concentration of from p170 to 180 g/l.

60. The process of claim 51 wherein drying of the final plated substrate material is by air drying at ambient temperature and pressure.

61. The process of claim 54 wherein the weight of coating is from 15.0 to 25.0 weight percent, based on the total weight of final noble metal-coated active non-noble metal substrate material product.

62. The process of claim 54 wherein the weight of coating is 20.3 weight percent, based on the total weight of final noble metal-coated active non-noble metal substrate material product; said first individual plating solution bath is maintained at a temperature of 32° C; and said second individual plating solution bath is maintained at a temperature of 65° C.

63. A process for plating gold onto nickel according to claim 4, wherein said noble metal is gold; the source of the free ions of the gold is potassium gold cyanide; said non-noble metal substrate material is nickel powder having spherical particles with a mean diameter of from 8 to 10 microns; the weight of coating is from 15 to 60 weight percent, based on the total weight of final noble metal-coated active non-noble metal substrate material product; said starter plating solution is divided into 4 equal portions with 4 said individual plating solution baths being prepared therefrom, such that 25% of the total amount of free ions of noble metal to be plated out is contained in the first individual plating solution bath; 10% to 20% of the total amount of free ions of noble metal to be plated out is contained in each individual plating solution bath; the first individual plating solution bath is maintained at a temperature of from 50° C. to 80° C.; the second through fourth individual plating solution baths are maintained at a temperature of from 85° C. to 100° C.; said first series of water rinse steps comprises the sequence of steps of rinsing twice with hot water; said second series of rinse steps is repeated 4 times in succession after completion of said first series of water rinse steps following plating in the fourth individual plating solution bath, and comprises the sequence of steps of rinsing once with hot water; rinsing once with a 25% glacial acetic acid aqueous solution; rinsing a second time with hot water; and rinsing once with methanol; said third series of rinse steps is performed once and comprises the sequence of steps of rinsing 3 times with hot water, followed by rinsing 3 times with methanol; and the process further comprises cleaning and activating the nickel powder substrate material prior to its immersion in said first individual plating solution bath.

64. The process of claim 63 wherein cleaning and activation of the nickel powder comprises the steps of first mixing the nickel powder with liquid detergent to form a paste; mixing the nickel powder paste with a sodium or potassium cyanide activation solution; separating the cleaned and activated nickel powder from the activation solution; washing the activated nickel powder twice with hot water; and remixing the cleaned and activated nickel powder with liquid detergent.

65. The process of claim 63 wherein drying of the final plated substrate is by air drying at ambient temperature and 66. The process of claim 63 wherein the weight of coating is from 15.0 to 25.0 weight percent, based on the total weight of final noble metal-coated active non-noble metal substrate material product.

67. The process of claim 63 wherein the weight of coating is 16.0 weight percent, based on the total weight of final noble metal-coated active non-noble metal substrate material product; said first individual plating solution bath is maintained at a temperature of 75° C.; and said second through fourth individual plating solution baths are maintained at a temperature of from 94° C. to 98° C.

* * * * *